(12) United States Patent
Petrescu-Prahova

(10) Patent No.: US 9,755,402 B2
(45) Date of Patent: Sep. 5, 2017

(54) EDGE EMITTER SEMICONDUCTOR LASER TYPE OF DEVICE WITH END SEGMENTS FOR MIRRORS PROTECTION

(71) Applicant: Iulian Basarab Petrescu-Prahova, Trenton, NJ (US)

(72) Inventor: Iulian Basarab Petrescu-Prahova, Trenton, NJ (US)

( * ) Notice: Subject to any disclaimer, the term of this patent is extended or adjusted under 35 U.S.C. 154(b) by 0 days.

(21) Appl. No.: 14/731,576

(22) Filed: Jun. 5, 2015

(65) Prior Publication Data

US 2015/0303654 A1  Oct. 22, 2015

Related U.S. Application Data

(63) Continuation-in-part of application No. 12/803,476, filed on Jun. 28, 2010.

(51) Int. Cl.
*H01S 5/20* (2006.01)
*H01S 5/10* (2006.01)
(Continued)

(52) U.S. Cl.
CPC .......... *H01S 5/2031* (2013.01); *H01S 5/1014* (2013.01); *H01S 5/1082* (2013.01); (Continued)

(58) Field of Classification Search
CPC ........ H01S 5/22; H01S 5/1003; H01S 5/1014; H01S 5/2031; H01S 2301/18
See application file for complete search history.

(56) References Cited

U.S. PATENT DOCUMENTS

| 4,378,255 A | 3/1983 | Holonyak |
| 4,594,603 A | 6/1986 | Holonyak |
| (Continued) | | |

FOREIGN PATENT DOCUMENTS

| JP | H03795 B2 | 1/1991 |
| JP | 2008034663 A | 2/2008 |
| (Continued) | | |

OTHER PUBLICATIONS

Koch et al. ("Tapered waveguide InGaAs/InGaAsP multiple quantum well lasers", IEEE photonics Tech. Ltrs., vol. 2, No. 2, Feb. 1990).*

(Continued)

*Primary Examiner* — Tod T Van Roy
(74) *Attorney, Agent, or Firm* — Graham Curtin, P.A.

(57) ABSTRACT

Semiconductor laser device with mirror protection includes transversally a structure with a double waveguide, consisting of an active waveguide and a separated or adjacent trapping waveguide, and longitudinally a main segment and end segments, the thickness of the upper cladding of the end segments being gradually decreased toward the mirrors. In the main segment, the field distribution is asymmetric, preponderantly located in the lower cladding. In the end segments, the field distribution gradually further shifts toward the lower cladding. Along the end segments, the fundamental mode confinement factor $\Gamma$ is gradually and substantially reduced. The reduction of the confinement factor $\Gamma$ protects against degradation the projection of the active region on the exit mirrors, the laser element most sensitive to degradation.

14 Claims, 19 Drawing Sheets

(51) Int. Cl.
*H01S 5/22* (2006.01)
*H01S 5/16* (2006.01)

(52) U.S. Cl.
CPC . *H01S 5/16* (2013.01); *H01S 5/22* (2013.01); *H01S 2301/166* (2013.01); *H01S 2301/18* (2013.01)

(56) References Cited

U.S. PATENT DOCUMENTS

| | | | |
|---|---|---|---|
| 5,063,173 | A | 11/1991 | Gasser |
| 5,345,460 | A | 9/1994 | Takiguchi |
| 5,444,730 | A | 8/1995 | Mizutani |
| 5,513,204 | A | 4/1996 | Jayaraman |
| 5,665,637 | A | 9/1997 | Chand |
| 5,818,860 | A | 10/1998 | Garbuzov |
| 6,005,881 | A | 12/1999 | Ikoma |
| 6,037,189 | A * | 3/2000 | Goto ............ G02B 6/122 |
| | | | 117/956 |
| 6,080,598 | A | 6/2000 | Kaway |
| 6,272,161 | B1 | 8/2001 | Petrescu-Prahova |
| 6,522,677 | B1 | 2/2003 | Petrescu-Prahova |
| 6,618,409 | B1 | 9/2003 | Hu |
| 6,744,796 | B1 | 6/2004 | Chakrabarty |
| 7,251,381 | B2 * | 7/2007 | Buda ............ B82Y 20/00 |
| | | | 372/45.011 |
| 7,338,821 | B2 | 3/2008 | Ressel |
| 7,442,628 | B2 | 10/2008 | Yamane |
| 7,687,291 | B2 | 3/2010 | Charache |
| 7,830,938 | B2 | 11/2010 | Rossin |
| 2003/0086654 | A1 | 5/2003 | Saini et al. |
| 2004/0190575 | A1 | 9/2004 | Ghislotti et al. |
| 2007/0165685 | A1 | 7/2007 | Mizuuchi et al. |
| 2008/0259982 | A1 | 10/2008 | Kim et al. |
| 2011/0122907 | A1 * | 5/2011 | Schmid ............ H01S 5/1082 |
| | | | 372/43.01 |
| 2011/0317730 | A1 | 12/2011 | Petrescu-Prahova |

FOREIGN PATENT DOCUMENTS

| | | |
|---|---|---|
| RU | 2153746 C2 | 7/2000 |
| SU | 1329533 A1 | 5/1988 |
| WO | 9608062 A1 | 3/1996 |
| WO | 9857401 A1 | 12/1998 |
| WO | 2009143813 A1 | 12/2009 |

OTHER PUBLICATIONS

International Search Report with Written Opinion, mailed Mar. 10, 2016, for corresponding international application PCT/US2015/034351.
Search Report dated Apr. 25, 2012 in corresponding European Application No. 11009831.6.
Lee J J et al: "Asymmetric Broad Waveguide Diode Lasers (lambda= 980 nm) of Large Equivalent Transverse Spot Size and Low Temperature Sensitivity", IEEE Photonics Technology Letters, IEEE Service Center, Piscataway, NJ, US, vol. 14, No. 8, Aug. 1, 2002 (Aug. 1, 2002), XP011067237, ISSN: 1041-1135.
Mawst et al., "8 W continous front facet power from broadwaveguide Al-free 980 nm diode lasers" Appl. Phys.Lett., vol. 69, p. 1532, (1996).
Petrescu_Prahova et al., "High Brightness 810 nm Long Cavity Diode Lasers with high d/gamma Ration in Asymmetric Low Confinement Epitaxial Structures", Laser and Electro-Optics Society 2001 Conference, LEOS 2001 the 14th Annual Meeting of the IEEE, p. 135, (2001).
Petrescu-Prahova et al., "253 mW/um maximum power density from 9xx nm epitaxial laser structures with d/gamma greater than 1 um", IEEE 21st International Semiconductor Laser Corference, 2008, ISLC 2008, p. 135 (2008).
Crump et al., "Limitations to peak continous wave power in high power broad area single emitter 980 nm diode lasers", Conference of Laser and Electro-optics and the European Quantum Electronics Conference, CLEO Europe and EQEC 2009 Digest (2009).
Blauvelt et al., "Large opticasl cavity AlGaAs buried heterostructure window laser", Appl. Phys. Lett., vol. 40, p. 1029 (1982).
Baoxue et. al., "A novel structure for high peak power semiconductor lasers" ICO 20 Laser and Laser Technologies Conferences, Proc. of SPIE vol. 6028, 60280U, (2005).
USPTO Non-Final Office action mailed Feb. 8, 2012, for corresponding U.S. Appl. No. 12/803,476.
USPTO Non-Final Office action mailed Jun. 20, 2014, for corresponding U.S. Appl. No. 12/803,476.
Communication under Rule 71 (3) EPC dated, Oct. 12, 2016 according to which the Examining Division of the European Patent office intends to grant a patent for corresponding European Patent Application No. 11009831.6.
U.S. Non-Final Office action dated May 6, 2015, for corresponding U.S. Appl. No. 12/803,476.
U.S. Final Office action dated Oct. 15, 2015, for corresponding U.S. Appl. No. 12/803,476.
U.S. Non-Final Office action dated Apr. 6, 2016, for corresponding U.S. Appl. No. 12/803,476.
U.S. Final Office action dated Sep. 16, 2016, for corresponding U.S. Appl. No. 12/803,476.
U.S. Non-Final Office action dated May 9, 2017, for corresponding U.S. Appl. No. 12/803,476.
Xin, Gao, Qiao Zhongliang, Xu Liuyang, Yuan Xuze, Cao Xiwen, Xia Xiaoyu, and Bo Baoxue. "Development of high power diode lasers for high performance operation." In 2015 International Conference on Optoelectronics and Microelectronics (ICOM), pp. 65-68. IEEE, 2015.
Epperlein, Peter W. Semiconductor Laser Engineering, Reliability and Diagnostics: A Practical Approach to High Power and Single Mode Devices. John Wiley & Sons, 2013.
Thorlabs, Exhibit A, Reliability Study of LD808-SE500 (808nm, 500mW, Single Spatial Mode, To-9), Jan. 28, 2016.
Thorlabs, Exhibit B, Reliability of 785nm FP Laser (MESA waveguide), Jan. 4, 2017.
Thorlabs, Product Specification Sheet, 785 nm Grating Stabilized TO Can Laser Diode, 300 mW, LD785-SEV300, Sep. 27, 2016.
Thorlabs, Product Specification Sheet, 808 nm Grating Stabilized TO Can Laser Diode, 500 mW, LD808-SE500, Sep. 26, 2016.

* cited by examiner 1) continuous *linear*

2) continuous *exponential*

3) *quasi linear*

4) *quasi exponential*

EDGE EMITTER SEMICONDUCTOR LASER TYPE OF DEVICE WITH END SEGMENTS FOR MIRRORS PROTECTION

CROSS-REFERENCE TO RELATED APPLICATIONS

This application is a continuation-in-part of U.S. application Ser. No. 12/803,476, filed on Jun. 28, 2010, which is pending. The entire contents of U.S. application Ser. No. 12/803,476 is herein incorporated by reference.

FIELD OF THE INVENTION

The present invention relates to edge semiconductor lasers, known also as edge diode lasers, in particular, edge emitted semiconductor laser type of device with end segments for mirrors protection.

Embodiment of the present invention can be used to protect window facets against degradation. Protection is achieved by using longitudinal end segments including a planar structure that is gradually modified toward windows by simple gradual changes of a basic structure from which the amplifying main segment is built. The planar structures suited for window protection are asymmetric structures where the radiation field of the fundamental transversal mode is preponderantly distributed on one side of the active region. From practical point of view, in broad sense, by semiconductor laser it is understood both the semiconductor chip and the support in which the chip is embedded, support that has suitable mechanical, thermal, electrical and optical properties. In narrow sense, by semiconductor laser it is understood only the semiconductor laser chip that has its optical, electrical, thermal and mechanical properties, which may be essential for product success in the broad sense.

BACKGROUND

Laser oscillators and laser amplifiers are most known semiconductor type laser devices, in short, semiconductor laser devices. This application is related to edge emitter semiconductor lasers, wherein the amplification by stimulated emission (laser effect) is produced along a device that is millimeters long and the emission exits through mirrors, also known as windows, at the ends of the device. It is proper to define the laser resonator between two mirrors and the laser amplifiers between two windows. Nevertheless, the exit mirror of a laser device is often named the exit window or front window. It is known that the active region projection on the exit window facet is the element of the semiconductor type laser device that is most sensitive to degradation. This is the place where Catastrophic Optical Degradation (COD) and important gradual degradation processes occur. COD processes exist also at the rear mirror but are less intense because the optical power is lower. These degradation processes represent important factors that determine the limits for the operation of these lasers at high power and at high power density of the radiation that traverse the exit window. The power density is defined sometimes as power flux per unit window area and other times as linear power density, i.e. as the power flux per unit width of the exit aperture. The catastrophic degradation is practically instantaneous when the power density of the radiation, emitted through the active region at the window facet, overpasses certain threshold values. The values for the power density of the emitted radiation that passes through the active region and produce catastrophic degradation are, in a great extent, material characteristics. In some cases, the gradual degradation starts from the windows, having in the end, after a period, the same effects as the catastrophic degradation, i.e. the irremediable destruction of the windows and of the laser. To avoid degradation, it is recommended to operate the laser at power levels and power density levels lower than the catastrophic degradation levels.

The catastrophic degradation is produced with the contribution of electronic states at the exit windows facets, surface states that modify the distribution of the electrical potential and the light absorption phenomena in the superficial layer at the semiconductor material-external medium interface. Oxygen is the most deleterious element that produces a great amount of surface states. To remedy the effects induced by these surface states several solutions for obtaining less sensitive "windows" for semiconductor laser were imagined:

1) The solutions that address the layered semiconductor laser structure itself by lowering the ratio of the emitted power through the mentioned most sensitive window element relative to the total emitted power, ratio also known as active region confinement factor $\Gamma$;
2) The solutions that address the passivation of the exit window facets;
3) The solutions that address the introduction of an entire end segment with a modified layered structure situated longitudinally between the main amplifying segment and the exit window, end segment that protects the exit window.

In this section, the existing solutions related to the point 1) and 3) are discussed as being closely related to the subject matter of the present invention. These solutions avoid the cumbersome methods related to mirror facets passivation.

Among the solutions which address the lowering of the confinement factor $\Gamma$, the closest is a solution that utilizes an asymmetric double waveguide transversally comprising an active waveguide and a passive trapping waveguide situated at one side of the active waveguide, wherein part of the radiation emitted in the active region is captured by the passive trapping waveguide. The waveguides are limited by cladding layers, known also as confinement layers, which limit the transversal extent and may contain the exponential decay of radiation distributions. The double waveguide is designed to amplify preferentially the fundamental mode with the same phase over the both waveguides.

The active waveguide contains the active region, consisting of one or more quantum wells separated by quantum barriers or may have the width larger than what is commonly understood by quantum well. The active region is usually contained in an active waveguide or can form alone, intrinsically, the active waveguide.

Such constructions with double waveguides were disclosed in the U.S. Pat. No. 6,522,677. In this publication, structures with confinement factor less than 0.015%, even for large active regions, wider than 10 nm, have been described. Reduced confinement factor reduces the modal gain and allows the use of long waveguides, longer than 2 mm. The reduced confinement factor, reducing the power density traversing the output window through the active region, also increases the total emitted power for which the catastrophic degradation occurs. For such constructions, better and better outcomes were obtained, described for example in non-patent literature documents by Petrescu-Prahova et al. [1] and [2]. At very high power density, the catastrophic optical degradation remains an issue.

The transversal structures with double waveguide mentioned in above are well suited for being used in longitudinal structures comprising at least two longitudinal segments: a main one, where amplification of the radiation occurs, and an end one, adjacent to the front window, where the active region was completely removed and replaced with a semiconductor material with suitable optical properties. Such construction was described in U.S. Pat. No. 6,272,161. The essential fact for the construction of this patent is that the overlapping integral $I_{00}$ between the functions describing the radiation distributions of the transversal fundamental mode in the two mentioned segments has values very close to unity, what reduces the coupling loss L when crossing the interface, approximately equal to $L=1-|I_{00}|^2$. The advantage of this construction is that no radiation exits through the active region at the output window because the active region was completely removed. In this publication, the etch-regrowth method for construction of end segment is proposed. All upper layers, including the active region, were removed by etching from a segment adjacent to the window and after that were replaced with other layers with suitable optical properties by regrowth. The construction described in U.S. Pat. No. 6,272,161 has the disadvantage that the etch processes followed by regrowth are difficult to be processed and, also, that the degradation processes can be moved from front window toward the interface between the main segment and the end segment, with the participation of etch defects remaining at the extremity of the unetched active region.

A construction transversally based on a symmetric structure and longitudinally consisting of at least two segments was described in non-patent literature document by Baoxue et al. [3]. The construction is presented schematically in FIG. 1. The transversal structure has a core waveguide 01, a lower cladding 02 and an upper cladding 03. The structure has the same composition and thickness for both claddings. Longitudinally, the construction has a main segment 020 and an end segment 021. The end segment is formed by removal of part of the upper cladding in a single step, in an etch process that does not touch the active region. The refractive index profile for such a structure is shown schematically in FIG. 2A. FIGS. 2B and 2C shows schematically two other transversal structures used for the construction of two longitudinal segments.

It is desirable that removal of part of the upper claddings in the construction of FIG. 1 would have had the effect of reducing the confinement factor $\Gamma$ for the fundamental mode, which reduces the power density that passes through the active region at the exit and also increases the total emitted power for which the catastrophic degradation occurs. A complementary effect is that the coupling integral between the fundamental modes of two segments becomes less than 1. As the etch depth of the upper cladding 03 increases, the overlapping coupling integral $I_{00}$ decreases and the coupling loss L increases. It is essential that the coupling integral between the fundamental modes of both segments to remain close to unity. It is generally assumed that the deeper is the removed part of the upper layers the greater is the confinement factor reduction for the fundamental mode, but this is not always true. The construction proposed in non-patent literature document [3], with a symmetric transversal structure, has the disadvantage that the confinement factor $\Gamma$ firstly increases as the etch depth increases and the loss is already too significant when the confinement factor $\Gamma$ starts to appreciably decrease. The relation between the variation of the $\Gamma$ factor and the increase of coupling loss calculated for the symmetric case is shown in FIG. 3 for the symmetric 808 nm structure described in Table 1, row (a).

Another transversal structure for a construction of FIG. 1 is described in U.S. 2011/0317730 A1. It is based on an asymmetric structure, with a thin upper cladding 03 having a low refractive index and a thick lower cladding 02 having high refractive index. The profile of the refractive index is shown schematically in FIG. 2B. In FIG. 3 is shown a better, acceptable relation between the decrease of the $\Gamma$ factor and the increase of coupling losses, i.e. the asymmetric curve is closer to the $\Gamma$ axis than the symmetric curve. An exemplifying 808 nm asymmetric structure is described in Table 1, row (b).

Another transversal structure for a construction of FIG. 1, also proposed in U.S. 2011/0317730 A1, includes a double waveguide. FIG. 2C shows schematically the profile of the refractive index of a transversal double waveguide structures. A further improvement in the relation between the decrease of the $\Gamma$ factor and the increase of coupling loss is shown in FIG. 3, for an 808 nm exemplifying double waveguide structure described in Table 1, row (c).

The cases B and C of FIG. 3 show that the reasonable reduction of confinement factor $\Gamma$ should not be lower than 60%-70% of the value $\Gamma_0$ in the main segment, due to the very high values for coupling losses afterword. Constructions described in U.S. 2011/0317730 A1 have the limitation that the decrease of the confinement factor for the fundamental mode in the end segment adjacent to the front window, compared to the confinement factor of the main segment, is relatively low, only ×1.3-×1.5. This decrease is limited by the enhancing of the complementary effect, namely the decrease of the fundamental mode coupling, when the etching is too deep.

In an embodiment of the present invention, a substantial higher decrease of the confinement factor $\Gamma$ for the fundamental mode both at the front exit window and at the rear window, usually a reflecting mirror, is obtained. Both windows are conventionally called exit windows or in short windows. The substantial decrease of the confinement factor $\Gamma$ at windows by the use of end segments described in this invention is obtained with better coupling between fundamental modes of the two sections with the avoidance of high transfer losses to higher-order modes that could reduce significantly the semiconductor laser efficiency. By this construction, a significant increase of total power needed for destroying windows by catastrophic degradation is obtained. By the excellent window protection when semiconductor laser operates at high power, the possibility of catastrophic degradation is reduced and the gradual degradation processes are considerably slowed.

It is the object of this invention to use planar asymmetric, double waveguide, low confinement semiconductor laser layered structures for the main, amplifying segment and to use modified transversal layered structures for the end segments for protecting mirror facets.

SUMMARY

An embodiment of the invention provides an edge emitter semiconductor laser that includes longitudinally at least two longitudinal segments: a main segment, where the radiation amplification occurs, and at least one end segment, adjacent to an exit window (FIG. 5). The semiconductor laser may include a second end segment adjacent to a rear window. The main segment has a main planar, layered optical structure that includes a double waveguide that allows only the amplification of the fundamental transversal mode, which is best coupled with the active region and has the highest confinement factor among all modes. The transversal field distribution of the fundamental mode does not intersect a transversal axis and has the same phase in both waveguides of the double waveguide. To such a near field distribution, corresponds in far field a symmetric bell shaped distribution. The end segments have planar layered optical structures derived from the main structure. Both optical structures have asymmetric index of refraction profiles relative to a planar core waveguide that contains the active region. In the main segment, the radiation generated in the active region spreads out and decays toward the margins of the claddings surrounding the core waveguide of the structure. The claddings confine the radiation generated in the active region and contain part of it. The asymmetry in structure determines an asymmetry of the propagating radiation field distribution in a transversal section of the main segment, such that the radiation field is preponderantly distributed in the lower side of the optical structure. The radiation generated in the main segment propagates further in the end segments. The thickness of the upper cladding of the optical structures of end segments decreases gradually toward windows through a plurality of transitory structures. The gradual thickness reduction of the upper claddings, continuously or in steps, is done in a controlled manner along the length of end segments. When done in an etch process, the thickness reduction of the upper cladding of the optical structures is the etch depth. The thickness reduction of the upper cladding of the optical structures produces a substantial decrease of the fundamental transversal mode confinement factor $\Gamma$ at the window facets. The fundamental transversal mode confinement factor $\Gamma$ will be named in short the $\Gamma$ factor. The substantial decrease of the $\Gamma$ factor, as great as an order of magnitude, can produce the decrease by about an order of magnitude of the power density reaching windows facets through the active region relative to the power density passing through the active region when end segments would be missing. The reduction of the power density that reaches window facets through the active region has the effect of reducing degradation processes specific for windows. The control over the gradual reduction of the upper cladding of the optical structure is designed to temper and reduce at low values the transfer losses from the fundamental mode to higher order modes, in spite of the substantial decrease of the $\Gamma$ factor.

DETAILED DESCRIPTION OF THE PREFERRED EMBODIMENTS

Figure 1:
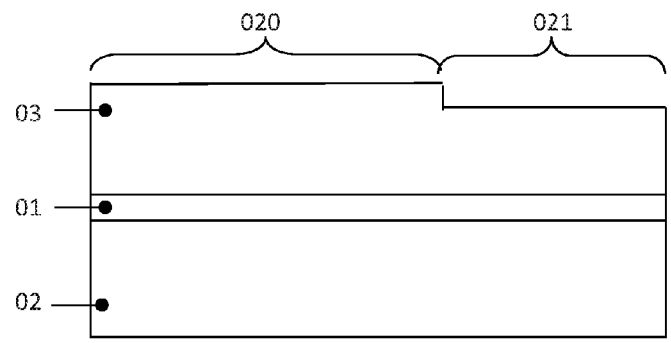
FIG. 1 illustrates a longitudinal section in a structure with an end segment with a single etch step.
Figure 2A:
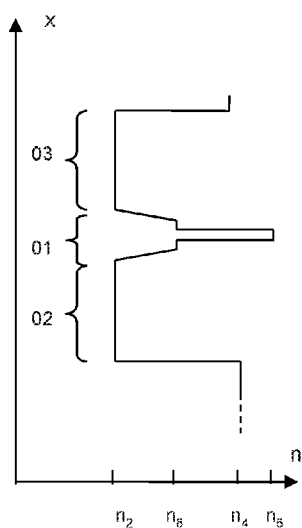
FIG. 2A shows the refractive index profile for a symmetric structure.
Figure 2B:
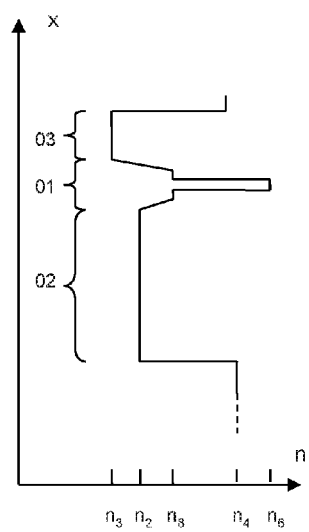
FIG. 2B shows the refractive index profile for an asymmetric structure with the refractive index higher in its lower cladding than in its upper cladding.
Figure 2C:
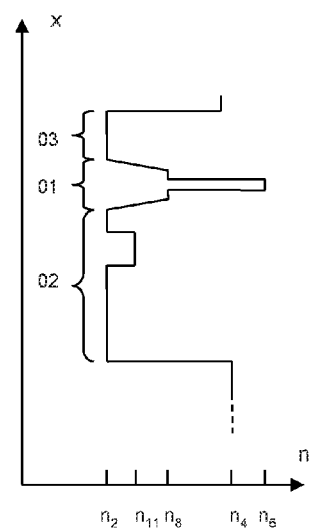
FIG. 2C shows the refractive index profile for a structure with a secondary trapping waveguide included in the lower cladding and separated from the core waveguide by a separation layer.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

Structures and their Features

The key features of the novel combined transversal-longitudinal structures will become apparent from the discussion on model structures. The examples will be constructed on GaAs substrates from materials belonging to the AlGaAs system for most layers and from AlGaAs and InAlGaAs system, including InGaAs, for quantum wells. These types of materials, especially those for quantum wells are very sensitive to window's degradation induced by radiation power reaching the windows through the active region, especially at the front window. Those familiar with the semiconductor laser know that such processes can occur in other III-V compound materials, such as GaAsP, InGaP, InAlGaP and others, and also in semiconductor compounds made from other types of elements.

The semiconductor lasers in the following examples are intended for emission at the wavelength $\lambda=808$ nm, a wavelength widely used in practice. This choice does not limit the invention to these wavelength. Embodiments of the present invention can be applied with the same effects not only in the entire range of possible wavelengths in AlGaAs and InAlGaAs systems, i.e. from 700 nm to 1180 nm, or beyond these limits, but can be extended to other wavelength ranges by changing the construction materials. The epitaxial layered structures can be formed by one of the methods MOCVD (Metalo-Organic Chemical Vapor Deposition), MBE (Molecular Beam Epitaxy) and others.

Thus, the construction start on a planar GaAs substrate over which a number of epitaxial planar layers with well defined geometric properties, i.e., thicknesses, and optical properties, i.e., refractive indexes, are placed. The initial planar structure is the base for the formation of end segments. In the $Al_xGa_{1-x}As$ and $In_y(Al_xGa_{1-x})_{1-y}As$ systems the optical properties are determined by the composition indexes x, y, by the density of free carriers and, in the case of the active region, by the degree of excitation for stimulated emission, expressed by the imaginary part of the refractive index, derived from the gain coefficient. Sometimes, for the quantum wells, instead of mentioned x and y indexes, the photoluminescence wavelength of each quantum well is mentioned. Essential for the modal field distributions and for the modal effective refractive indexes are the refraction indexes of materials making up the structures. In most cases, for the disclosure that follows, the imaginary part of these indexes, which are determined by absorption or amplification processes, can be and are neglected.

Figure 4:
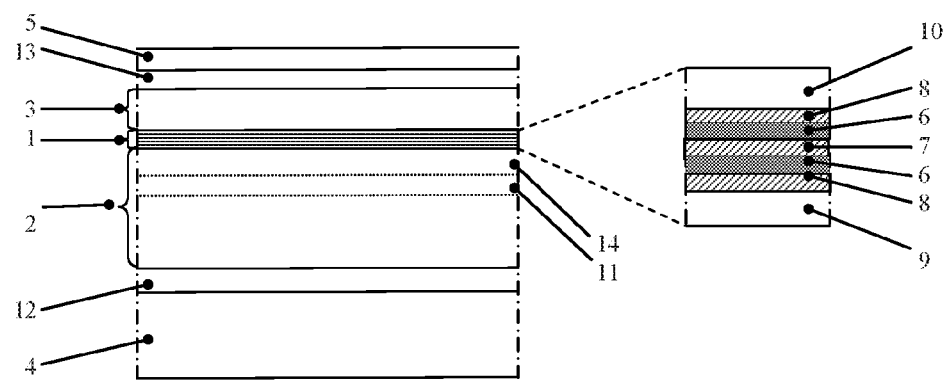
FIG. 4 is a transversal section in a basic structure in accordance with an embodiment of the invention.

FIG. 4 represents a section in basic layered structure that defines an epitaxial layered construction for the semiconductor laser suited for the object of an embodiment of the invention. Epitaxial layered structure includes as basic substructures: a core planar active waveguide 1, a lower planar cladding 2 of the structure and an upper planar cladding 3 of the structure. Claddings 2 and 3 are named primary claddings. Structural elements 1, 2 and 3 are encompassed between a substrate 4 at the bottom and a contact layer 5 at the top. It is beneficial that a secondary lower cladding layer 12 exists between the cladding 2 and the substrate 4 and a secondary upper cladding layer 13 exists between the upper cladding 3 and the contact layer 5. The secondary cladding layers have their refractive indexes lower than the refractive indexes of their respective primary claddings. The qualifiers lower, upper, bottom and top are conventional, being related to the most usual position during epitaxial growth and processing. The primary claddings have the basic role to confine to the core the radiation generated in the core, a confinement that is only partial in modern devices, since the radiation generated in a thin core extends outside the core. The confinement is completed in the lower and upper claddings themselves, due to the evanescent decay toward the cladding's margins. The secondary claddings have the role to confine almost completely the radiation in essential structural elements 1, 2 and 3. The substructures 1, 2, and 3 can consist of plurality of layers.

The layered structures proper for this invention are asymmetric structures: geometrically, with their upper claddings narrower than their lower claddings, and optically, with suitable different optical properties included in the cladding's substructures. The structures and their substructures are defined by their transversal spatial distributions of the refractive index. The structure's asymmetry determines the asymmetry of the radiation field distribution that propagates in the structure. In this invention, the radiation is preponderantly distributed in the lower cladding. Specific structures, their substructures and asymmetric radiation distributions will be disclosed next.

FIG. 4 further details the components of each substructure. The core active waveguide 1 include the active region that comprises the one or more Quantum Wells (QWs), 6, that form the active region. QWs are each a few nanometers wide. The devices can also operate with a wide active region, wider than what is commonly understood by a QW. QWs are separated by Quantum Barriers (QBs) 7 and possibly encompassed by external barriers 8. The elements 6, 7 and 8 or a single thick layer form the active region system. The active region system can form alone the core waveguide. Preferably the active region system is surrounded by a lower waveguide layer 9 and upper waveguide layer 10. More preferably, when made of materials of AlGaAs system, layers 9 an 10 have a variable band gap that decreases toward the value of QBs band gap from the band gap of adjacent claddings 2 and 3. These variations induce an increase of the refractive index toward the external QBs refractive index.

The current classic semiconductor laser optical structure is symmetric, both claddings 2 and 3 having equal thicknesses and equal refractive indexes. In an embodiment of this invention, the desired property, namely the asymmetry in the radiation field distribution is obtained mostly by specific properties of the lower cladding 2 of the optical structure. Fundamentally, the asymmetry is obtained by raising in average the refractive index of the lower cladding 2 compared with the refractive index of the upper cladding 3. A first way for this rising is by using uniform, but different compositions for the materials that constitute claddings 2 and 3. The refractive indexes for these materials, $n_2$ and $n_3$, satisfy the relation $n_2 > n_3$. Another way for this raising is to include in the lower cladding 2 a secondary trapping waveguide 11 that has a refractive index $n_{11}$ which is higher than $n_2$. The refractive index $n_{11}$ satisfies the relation $\bar{n}_{11} > n_2$, where the bar above $n_{11}$ indicates the average value. As a component of the lower cladding, the trapping waveguide is represented with dashed lines. The core waveguide 1 and the trapping secondary waveguide 11 form a double waveguide. Between the core waveguide 1 and the trapping waveguide 11 there is an separation layer 14. In another arrangement, the secondary trapping waveguide 11 is adjacent to the core waveguide 1, without the separation layer 14. In this case, the double waveguide is an adjacent double waveguide.

All described structures need to satisfy the basic requirement for the operation only in the fundamental transversal mode. For a simplified discussion, the cladding refractive indexes far away from the core are considered uniform and the claddings are extended to infinite. The field propagating in the core waveguide will evanescently decay to zero far away from the core. In such ideal structure only a finite number of modes can propagate in the waveguide, the others being cut off. It is known that for fibers, the cut-off of all modes except for the fundamental transversal mode is satisfied when an optical measure defined by the V-number expression is smaller than a certain critical value. A similar optical measure can be defined for planar waveguides. For a planar structure having only the core waveguide a suitable optical measure is $OM = (\int \sqrt{(n^2 - n_2^2)} dx)/\lambda$, where n is the variable refractive index in the transversal direction x of the waveguide, $n_2$ is the refractive index of the extended lower cladding 2. $\lambda$ is the radiation wavelength. In order for a planar structure that does not have a secondary waveguide to support only the transversal fundamental mode and the higher order modes to be cut off, OM should be smaller than 1. For OM=1 the field of the fundamental transversal mode is almost completely confined to the core. For smaller values, the field extends outside the core, in claddings 2 and 3, an extension desirable in order to reduce the fundamental confinement factor. For a structure with a secondary trapping waveguide, the optical measures for both waveguides should be added. In a structure with adjacent trapping waveguide, with OM values close to 1, the optical field can be confined in these two waveguides and still have low fundamental transversal mode confinement factors values.

In reality, higher order modes are inherent to any practical structure, being optically bounded by the secondary claddings 12 and 13 or, if they are absent, by substrate 4 and the contact layer 5 and next by the metal contacts, optical coatings, etc. A test that the structures with uniform cladding refractive mentioned in the former paragraph operate in the fundamental transversal mode is that the effective refractive index of the 1$^{st}$ order mode is lower than the highest cladding refractive index, i.e., lower than value $n_2$ of the cladding 2.

In semiconductor lasers, the existence of the substrate is sometimes annoying since modes can be defined for the substrate, which itself is a waveguide. The modes located mostly in the epi structure are named epi-modes. The modes located mostly in the substrate are named substrate-modes. Epi-modes and substrate-modes can reach resonance when they have the same effective refractive index. At resonance, the fundamental mode in the main segment, which is an epi-mode and it is amplified by the excited active region, can extend in the substrate and be partially absorbed. In the end segments, where higher order modes are excited by the coupling to the fundamental mode, resonance of higher order modes with substrate modes can be an extra source of losses. The secondary lower cladding layer 12 avoids the resonance between the epi- and substrate-modes.

Somewhere between the core waveguide margins is situated a p-n junction, which is the electrical means for active region excitation. In addition to its optical role as a waveguide, the core waveguide has also the role of carrier collection, both electrons and holes, that recombine in the active region. The lower cladding 2 has the same doping type as the substrate 4 and the upper cladding 3 and the contact layer 5 have the opposite type of doping. Usually, for devices made of AlGaAs system, the lower elements are n type and upper elements are p type. Obviously, this does not exclude from situations where doping is reversed.

Figure 5:
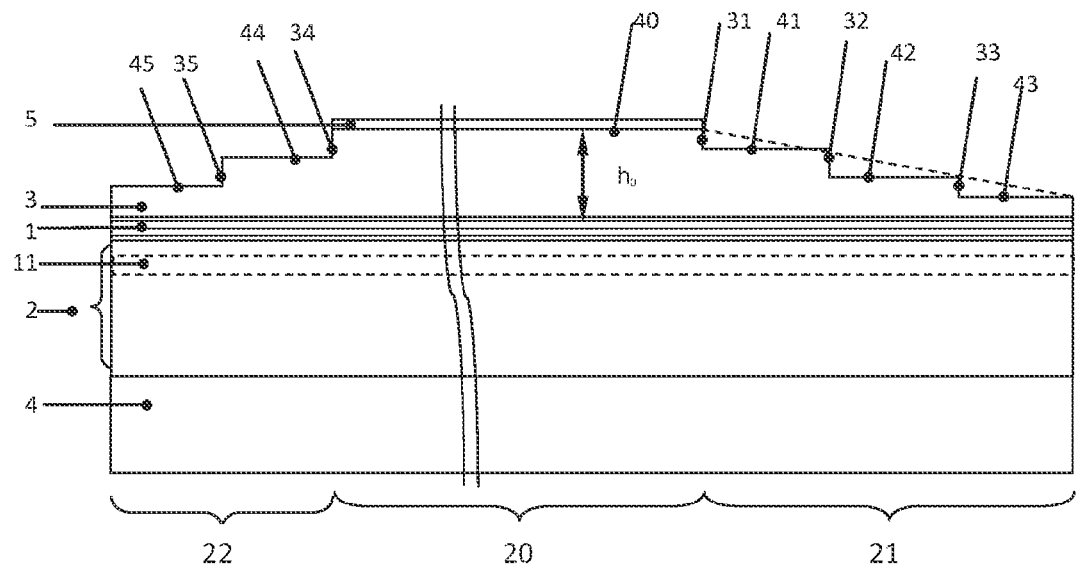
FIG. 5 is section along the longitudinal direction of the semiconductor laser that contains a main segment and end segments where the thickness of the upper cladding of the optical structure gradually decreases in steps in accordance with another embodiment of the invention.

FIG. 5 represents a section in longitudinal direction of a longitudinal structure of the semiconductor laser according to the invention. The longitudinal structure is composed of a main segment 20, where amplification by stimulated emission occurs, and end segments 21 and 22, which are designed to gradually transform the radiation field intensity distribution of the fundamental mode when the radiation flow traverses the end segments and to temper the transfer losses to higher order modes. End segments 21 and 22 are vertically tapered waveguides, as described in non patent literature document [4]. End segments are not necessarily identical. Rear end segment may even not be present if power reaching the rear window through the active region is not great enough to cause more intense degradation than that at the front window protected by the 21 segment. End segments are not necessarily excited for stimulated amplification. In this case, the core waveguide in end segments is not any more active.

In FIG. 5 the thickness h of the upper cladding 3 of end front segment is gradually reduced toward the windows in a plurality of steps. Each step has its own transitory structure. $h_0$ is the initial thickness of the upper cladding 3, between the element 3-5 interface and the element 3-1 interface. In a starting approximation, the decrease of the thickness for the upper cladding 3 is done in increments of height $\Delta h_i$, identified by an index i, from the height $h_{i-1}$ to the height $h_i$. Note that $\Delta h = h_i - h_{i-1} < 0$. Instead of heights $h_i$ is convenient to use thickness reductions or etch depths $b_i$ equal to $b_i = h_0 - h_i$. The upper cladding 3 of the main segment has the depth $b_0 = 0$, i.e., its upper cladding 3 is not modified. For each step, the incremental etch depth increase $\Delta b_i$ from the previous etch depth $b_{i-1}$, which corresponds to the height $h_{i-1}$ of the upper cladding 3, is $\Delta b_i = b_i - b_{i-1} = -\Delta h_i > 0$. FIG. 5 shows the step risers 31, 32, 33, 34, 35 and step treads 41, 42, 43, 44, 45. Each tread has a well-determined length $\Delta z_i$. The main, unchanged segment 20 ends before joining the end segment at $z_0 = 0$. $z_{i-1}$ is the distance from the beginning of the modified end segment to the beginning of the step i tread. $z_i$ is the distance from the beginning of the modified end segment to the end of the step i tread. Thus, the length of a step tread is $\Delta z_i = z_i - z_{i-1}$. Reduction of the thickness of the upper cladding 3 may continue until the thickness becomes zero.

For devices of some embodiments of this invention with a trapping waveguide, since the decrease of the thickness of the upper cladding 3 along the length of the end segment reduces the danger for window degradation, after complete removal of this cladding, supplementary removal of the core waveguide does not impede on device operation. Radiation will further propagate through the trapping waveguide. This observation opens the way toward a few new or enhanced additional structure functionalities:
 a) structure for SM operation with cylindrical lens for lateral focalization;
 b) structure for efficient distributed back reflector acting on radiation propagating in trapping waveguide.

These structures will be described in a following section.

The slope of a step is $sl_i = \Delta b_i / \Delta z_i$. If the depth of the risers are proportional with step treads, then sl is a constant, $\Delta b_i = sl \, \Delta z_i$. In this case, the stepped gradual thickness reduction b is linear. Its average slope is equal to sl. FIG. 5 represents the stepped linear thickness reduction. Thickness reduction in steps, but in a manner other than linear are possible.

Figure 6:
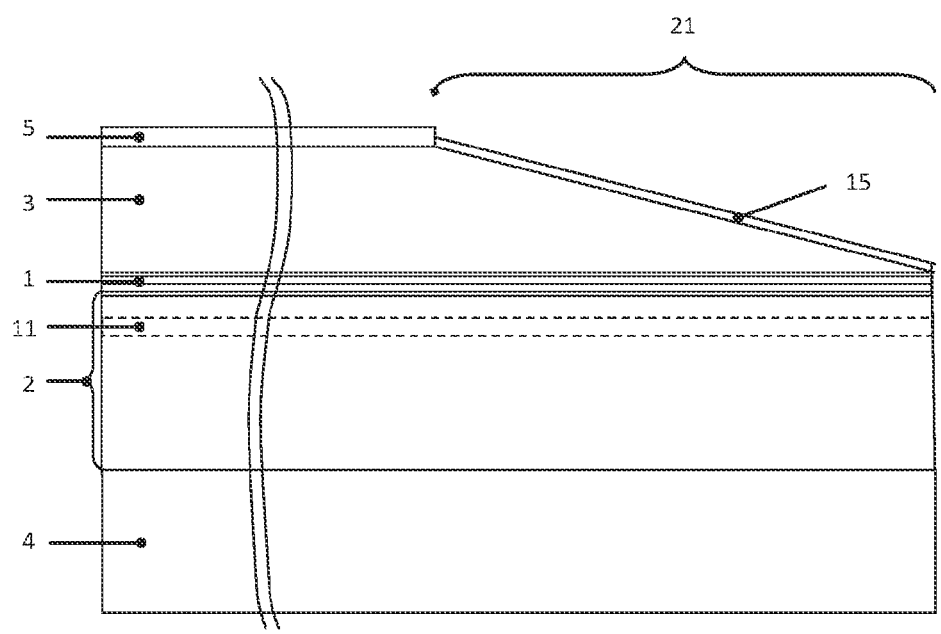
FIG. 6 is a section along the longitudinal direction of the semiconductor laser that contains a main segment and an end segment where the thickness of the upper cladding of the optical structure decreases continuously in accordance with another embodiment of the invention.
Figure 7A:
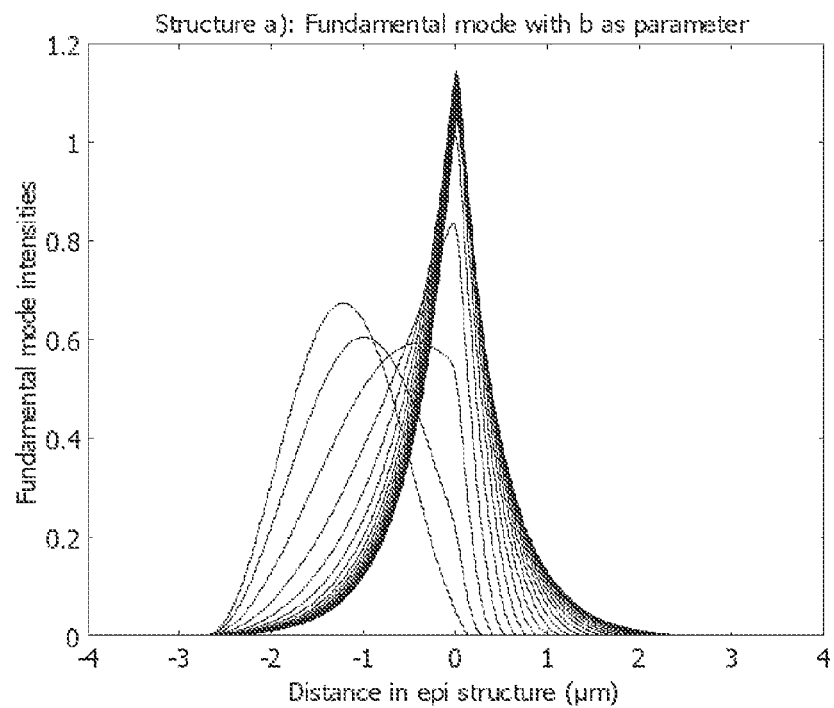
FIG. 7A shows the distribution of fundamental mode field intensity along a transversal direction when the thickness of the upper cladding decreases in 20 equal thickness intervals for a symmetric structure.
Figure 7B:
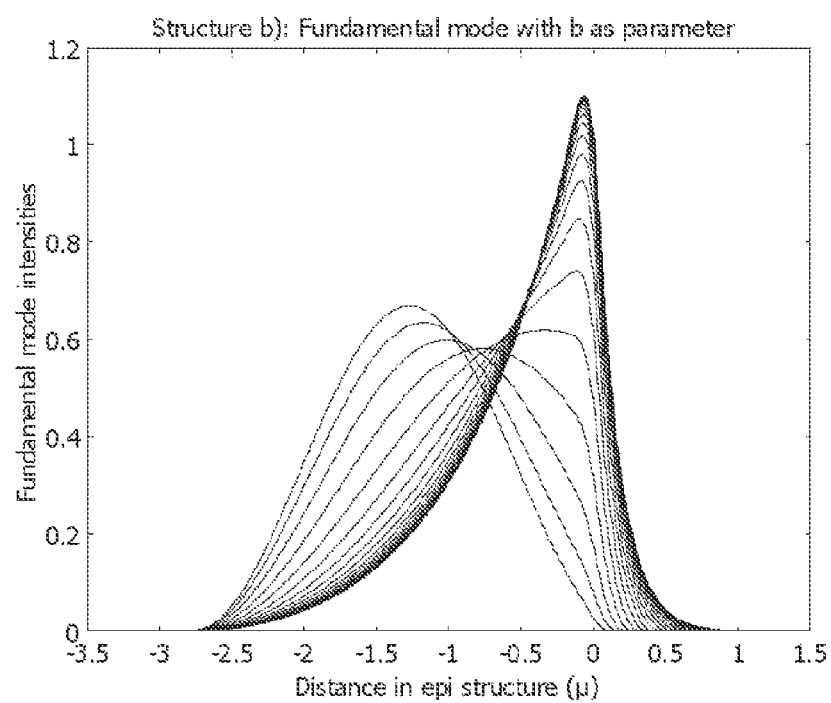
FIG. 7B shows the distribution of fundamental mode field intensity along a transversal direction when the thickness of the upper cladding decreases in 20 equal thickness intervals for a structure with the lower cladding refractive index higher than the upper cladding refractive index.
Figure 7C:
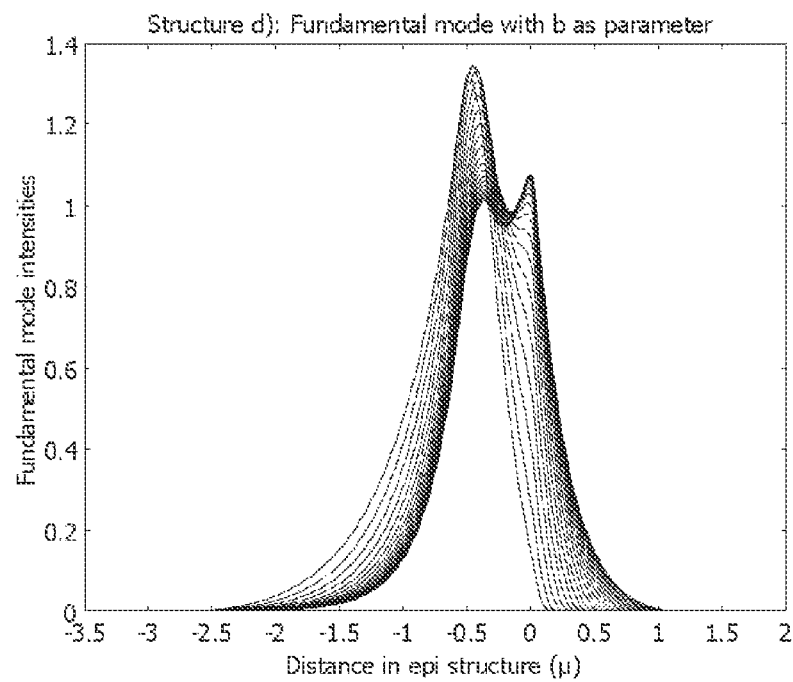
FIG. 7C shows the distribution of fundamental mode field intensity along a transversal direction when the thickness of the upper cladding decreases in 20 equal thickness intervals for a structure with a secondary trapping waveguide separated from the core waveguide by a separation layer.
Figure 7D:
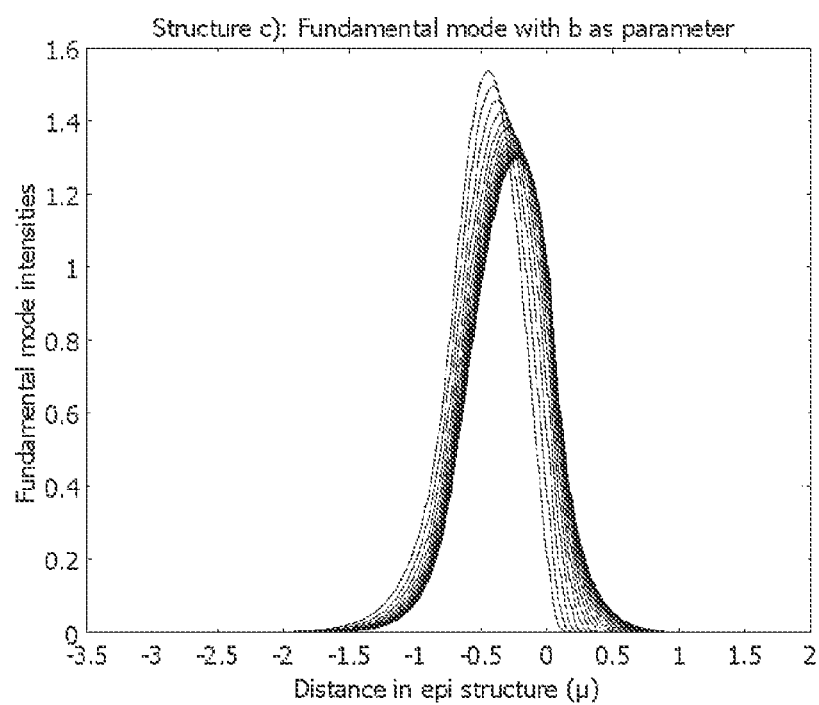
FIG. 7D shows the distribution of fundamental mode field intensity along a transversal direction when the thickness of the upper cladding decreases in 20 equal thickness intervals for a structure with a secondary trapping waveguide adjacent to the core waveguide.

FIG. 6 represents a cross-section in the longitudinal direction of another longitudinal structure according to an embodiment of the invention, wherein the end segments have a continuous gradual thickness reduction b with a constant slope sl of the upper cladding 3. In this case the b vs. z dependence is described by a continuous linear function $b(z) = z \, sl$. There are possible other than linear dependences for the function b(z), in which case the slope sl is: $sl(z) = db(z)/dz$. Abrupt drops of height h can be described by sl(z) functions approximating delta functions.

The secondary lower cladding layer 12 (FIG. 4), placed between lower cladding 2 and the substrate 4, has a beneficial effect for limiting the penetration in the substrate 1 of the field distributions, both fundamental transversal mode and higher order modes field distributions, when the fundamental mode enters the end segments. The secondary upper cladding layer 13 (FIG. 4), placed between the upper cladding 3 and the contact layer 5, is beneficial in limiting the extent of the field distributions to the upper cladding 3 of the main segment and thus the thickness of the upper cladding 3. The secondary upper cladding layer 13 reduces the total thickness of the upper cladding 3, which is the controlling element of the operation of end segments. The upper cladding layer 13 will be firstly removed in the end segments, followed by the thickness reduction b of the upper cladding 3.

For semiconductor lasers built from AlGaAs system on GaAs substrate and for active region photon energies greater than the substrate band gaps, the field distribution in the lower cladding 2 tends to zero at the lower cladding-substrate interface, since the substrate is highly absorbent. As a strong absorber the substrate behaves as a partial reflector. The interface between the lower cladding 2 and the substrate 4 is a quasi barrier both for the epi-modes and substrate-modes. Both epi-modes and substrate-modes have only a small extension in the opposite side. The quasi barrier limits the interaction between these modes.

For the case of active region photon energies smaller than the substrate band gap, the substrate is less absorbent. In the end segments, the higher order modes which inherently are generated by coupling with the fundamental mode, are all prone to extend in the substrate. At particular thicknesses of the upper cladding 3 of an end segment one of the higher order mode incidentally can be in resonance with a substrate mode and be absorbed. In an continuously graded end segment, where the effective refractive index of epi modes is changing with distance, the resonant condition can be overpassed over a very small distance. In an end segment where the upper cladding 3 thickness is changed in steps, the resonance of the higher order modes with substrate modes can be attained over longer distances at particular thicknesses of both the substrate and the upper cladding layer. Even in this case, the resonant condition can be surpassed by the inherent substrate thickness variation. The absorption of higher order modes in the substrate is negatively reflected in the total losses from the fundamental mode, since it diminishes the back coupling to the fundamental mode. The use of the secondary optical cladding layer 12 is advised for active region photon energies smaller than the substrate band gap. The lower optical cladding layer 12, acting as a boundary layer, prevents the extension of higher order modes in the substrate. This prevention might be useful at least for the lowest order modes, the $1^{st}$, $2^{nd}$ and a few other higher order modes, that couple most with the fundamental mode in the end segment.

End segments can be covered with a coating layer 15. When the coating is missing, the surrounding atmosphere or vacuum can be also considered as a coating in optical terms, with the refractive index equal to 1. The coating may be a dielectric, usually oxide or nitride, a layer of nonconductive wide band gap semiconductor material or a metal. These coatings acts as limiting-reflector layers for the field distributions extending from the upper cladding. Not as good from the optical point of view as a reflector, it may be also a burying layer, of the same nature as the substrate. If this layer is also a good conductor, the end segments can be excited for stimulated emission. However, due to their lower confinement factor $\Gamma$, even if they are excited, the end segments do not contribute substantially to the total gain. The excitation of end segments has nevertheless the advantage of avoiding absorption processes.

An embodiment of the invention prescribes general basic transversal epitaxial structure and the geometric structure of end segments necessary to minimize degradation processes at windows and, in the same time, to minimize fundamental mode transfer losses toward higher order modes. The main parameter that is a good measure for the probability of future degradation processes is the active region confinement factor $\Gamma$ for the fundamental mode at the exit from the exit end segment. Since the active region of the exit facet is the element most sensitive to degradation, the higher order modes reaching the exit facet should have collectively active region confinement factors not more than the fundamental mode confinement factor. A good limitation is that the confinement factor for the $1^{st}$ order mode to be less than 50% of their fundamental mode confinement factor.

In the structures of FIGS. 5 and 6, as the height h of the upper cladding 3 decreases, or the reduction b from the maximum thickness $h_0$ of the upper cladding 3 increases, the field distribution is pushed out of the core waveguide toward the lower cladding 2. Accordingly, the active region confinement factor for the fundamental transversal mode decreases. It is possible to achieve an order of magnitude decrease of the $\Gamma$ factor by a corresponding increase of the depth b. This possible decrease of the $\Gamma$ factor represents a great potential for protecting the exit widows by end segments. Nevertheless, an abrupt significant step decrease of the cladding layer thickness to the thickness corresponding to a very low $\Gamma$ factor induces very high transfer losses to higher order modes. Thus, a single abrupt, profound drop of the height h is not desirable. The prior art solution of using a single step decrease of the cladding layer thickness is a simpler, but only a partial solution to the problem of substantially reducing the $\Gamma$ factor of the fundamental mode in end segments.

The potential for protecting the exit windows can by exploited by the gradual decrease of the thickness of the upper cladding 3, through a plurality of transitory structures, that tempers the transfer of the radiation power to higher order modes.

In preparation for the understanding the functionality of end segments, a discussion is necessary based on the understanding of the coupling between any two different modes for each incremental reduction $\Delta h$ of the thickness h of the upper cladding 3. The method of local modes is used as an approximation for analyzing the modal field distributions accompanying the gradual variation of height h in a plurality of steps. The variation in a plurality of steps will become a continuous variation at limit $\Delta h>0$. At each step tread i, of length $\Delta z_i$, the field is propagating in modes corresponding to the transitory structure of the tread and to its optical properties. Tread modes are characterized by the tread's modal refractive indexes $n_{j,i}$ and normalized modal field distributions $E_{j,i}(x)$, where j is the mode order. Functions $E_{j,i}(x)$, are local functions, obtained considering the tread length as infinite. Modal propagation constants are $\beta_{j,i}=2\pi n_{j,i}/\lambda$, where $\lambda$ is the wavelength of the propagating radiation and $n_{j,i}$ is the local modal effective refractive index. The other end-segment step parameters are the incremental depth, $\Delta b_i$, the tread length, $\Delta z_i$, that together determine the step slope $sl_i=\Delta b_i/\Delta z_i$.

Normalized functions $E_{j,i}(x)$ can be calculated by solving in the transversal direction x, perpendicular to the y-z epitaxial structure plane, scalar equation for the electric field $E_y$, assuming $E_y$ uniform in the y direction. The direction y will be omitted in the following discussion. The index j=0 indicates the fundamental transversal mode and the indexes j=1, 2, 3 . . . indicate higher order modes. Index i=1 is assigned to the transition from the main segment to the first step and to the first step tread.

The step etch depths $b_i$ determine for each step the effective refractive index $n_{j,i}$ of modes of order j at tread i. The transition of the fundamental mode of the main segment in the first step tread of end segments as well as the transition of any mode j to any other mode k from a previous step tread i to the next step tread i+1 is accomplished by partial coupling with these other modes. It is generally accepted that coupling at a step is characterized by overlapping integrals between modal field distribution before and after the step. A pre-integral transmission factor is included and equal to $4(n_{j,i-1}n_{k,i}/(n_{j,i-1}+n_{k,i})^2$. It has a small influence due to small variation of the refractive indexes at a small step. The overlapping integrals are defined though by expressions of the type:

$$I_{jk,i}=4(n_{j,i-1}n_{k,i}/(n_{j,i-1}+n_{k,i})^2 (\int E_{j,i-1}(x)E_{k,i}(x)dx) \qquad (1)$$

At a step riser, it is also possible the coupling of the preexisting mode k back to mode j. This coupling is characterized by the overlapping integral $I_{kj,i}$ which is different from $I_{jk,i}$. In particular, these two coefficients have opposite signs. The coupling to modes propagating in reverse direction is neglected due to very small values for the pre-integral reflection factor.

The overlapping integrals $I_{jk,i}$ depends on the step depth $b_i$ and on relative depth of each step, i.e., the step riser, $\Delta b_i=(b_i-b_{i-1})$. For small steps, the dependence of $I_{jk,i}(\Delta b)$ on $\Delta b$ increases almost linearly as $\Delta b$ increases, starting at 0 for $\Delta b=0$. For a certain step, located at the depth $b_i$ the difference quotient of the overlapping integral can be calculated by calculating the coupling coefficient for that depth $b_i$ and for that depth variation $\Delta b_i$:

$$D^1 I_{jk}(b_i, \Delta b_i) = \Delta I_{jk}(b_i, \Delta b_i)/\Delta b_i = [I_{jk}(b_i, \Delta b_i) - I_{jk}(b_i, 0)]/\Delta b_i = I_{jk}(b_i, \Delta b_i)/\Delta b_i \quad (2)$$

Intrinsic coupling coefficients $C_{jk}$ are defined by these difference quotients: $C_{jk} = D^1 I_{jk}$.

The intrinsic coupling coefficients can in their turn be transformed into the coupling coefficients $K_{jk}$ relative to the distance $\Delta z_i$. If the point $z$ is located at the end of step $i$, $K_{jk}$ for point $z_i$ is:

$$K_{jk} = C_{jk} \Delta b_i/\Delta z_i = sl_i D^1 I_{jk}(b_i, \Delta b_i) = Sl_i I_{jk}(b_i, \Delta b_i)/\Delta b_i \quad (3)$$

In the limit, for a continuous variation of b vs. z relation (3) becomes:

$$K_{jk}(z) = sl(z) C_{jk}(b(z)) \quad (4)$$

Due to modal interaction and interchange, the mode's variation along the end segment, in the continuous limit, is described by modal wave functions f that include the slow variation of envelope amplitudes $a_j(z)$: $f = a_j(z) E_j(x) \exp(-j\beta_j z)$. The modal evolution can be obtained from the system of coupling equations for modal amplitudes:

$$da_j/dz = -j\beta_j a_j + \Sigma_{k \neq j} K_{jk} a_k \quad (5)$$

The system (5) can be solved by numerical methods, knowing $\beta_j$ and the coupling coefficients $K_{jk}$ as functions of z.

The case of a plurality of abrupt steps can be solved by a system similar to the system (5). The abrupt steps are localized at a plurality of points $z_I$ and the transition from one depth $b_{I-1}$ to $b_I$ over a small distance interval $\Delta z_I$. At these points the propagation constants undergo a sudden transition from $\beta_{j,I-1}$ to $\beta_{j,I}$, related to the variation of the effective refractive index on each tread I. The coefficients K, will be redefined over distances $\Delta z_I$ from relation (2) and (3) as: $K_{jk} = I_{jk}(b_I, \Delta b_I)/\Delta b_I \times \Delta b_I/\Delta z_I$, where $\Delta b_I$ is a deep step height and $\Delta z_I$ the step treads. $K_{jk}$ are zero elsewhere. At the limit $\Delta z_I \to 0$, the coefficients can be represented with the help of a succession of delta functions for K.

The numerical solutions are calculated by dividing the end segments in 1 μm $\Delta z$ intervals. Solutions are sought for different basic planar structures and for different shapes of the function sl(z), either continuous or in discrete steps.

Examples of Semiconductor Laser Transversal Structures

In Table 1 presents construction details of epitaxial structures, i.e., geometrical and optical properties, for a few chosen example of semiconductor laser. These epi structures were mentioned before. These structures are constructed on GaAs substrates from materials belonging to $Al_x Ga_{1-x} As$ system for most layers and from AlGaAs and InAlGaAs system for quantum wells. The optical properties are determined by the composition index x. The geometrical properties are determined by the layer thicknesses and the linear dependence of x when a variation is indicated for the waveguide layers. The design operating wavelength is 808 nm.

For the ease of comparison, the values for composition indexes are preserved from one structure to the other, when possible, with the layer thicknesses being the primary variables.

Only 4 structures are included in table 1, indexed from a) to d). These structures have the following features (the key wording is printed in italics):

a) a *symmetric* structure;
b) an *asymmetric* structure without a trapping waveguide, with the refractive index higher in its lower cladding than in its upper cladding;
c) a structure with a secondary trapping waveguide *separated* from the core waveguide by an separation layer;
d) a structure with a secondary trapping waveguide *adjacent* to the core waveguide.

All structures are designed to have an active region confinement factor of about 0.006-0.0065. These values for the confinement factor make the structures usable for device lengths of about 3-4 mm. As can be seen from the table not all structures have the same layer content. The basic structure a) is symmetric, with the same composition and thicknesses for claddings 2 and 3. The structures b), c), and d) are asymmetric, with lower cladding 2 larger than the upper cladding 3. As will be seen, the field distributions are preponderant on the lower cladding 2.

TABLE 1

Examples of epitaxial laser structures

| | Composition x, Thickness (μm) | Lower Cladding 12 | Lower Cladding 2 | Trapping Waveguide 10 | Separation Layer 14 | Lower Waveguide 9 | External Barrier 8 | QW 6 | External Barrier 8 | Upper Waveguide 11 | Upper Cladding 3 | Coating 15 |
|---|---|---|---|---|---|---|---|---|---|---|---|---|
| a) sym | Comp. index x Thick. | 0.80 0.50 | 0.50 2.5 | | | 0.50->0.45 0.10 | 0.45 0.007 | 0.006 | 0.45 0.007 | 0.45->0.50 0.10 | 0.50 2.51 | 0.4 |
| b) asym | Comp. index x Thick. | 0.80 0.50 | 0.50 2.5 | | | 0.50->0.40 0.16 | 0.40 0.007 | 0.006 | 0.40 0.007 | 0.40->0.54 0.04 | 0.54 1.01 | 0.4 |
| c) separate | Comp. index x Thick. | 0.80 0.50 | 0.50 2.0 | 0.45 0.25 | 0.50 0.25 | 0.50->0.40 0.07 | 0.40 0.007 | 0.006 | 0.40 0.007 | 0.40->0.50 0.07 | 0.50 1.01 | 0.4 |
| d) adjacent | Comp. index x Thick. | 0.80 0.50 | 0.50 2.6 | 0.45 0.60 | | 0.50->0.40 0.13 | 0.40 0.007 | 0.006 | 0.40 0.007 | 0.40->0.50 0.05 | 0.50 1.01 | 0.4 |

The structures in Table 1 were used for calculation of the field distributions, fundamental and higher order modes confinement factors, optical measures OM, modal effective refractive indexes and intrinsic coupling coefficients based on overlapping integrals. In modeling, the structures were bounded by Dirichlet boundary conditions. These conditions are justified since the structures were optically bounded at the lower cladding by an optical cladding 12 with lower refractive index and at the higher side by an optical coating with even lower refractive index, both being effective barriers against the field extension. In structures b), c) and d) the upper waveguide layer is thinner than the lower waveguide layer.

FIGS. 7A-7D show the field intensity distributions for the fundamental mode for all structures for easier comparison. The field distributions are modified by the modification of the thickness of their upper cladding 3. For all structures the upper cladding 3 is modified after complete removal of the secondary upper cladding layer 13. The thicknesses of the upper cladding 3 are modified by 20 equal variations, until their final thickness of 0.01 µm. The final thickness reduction b max, is 2.5 µm for structure a) and 1 µm for structures b) c) and d). It can be seen that only the last curves, after the upper cladding 3 thickness has reached a value of 40 . . . 50% of their original thickness, show a significant change in field distributions.

For the symmetric structure a), a significant change can be obtained, but only when the fundamental mode field is moved almost entirely in the lower cladding layer. Without a secondary lower cladding layer, the fundamental mode field will penetrate in the substrate. Also, without this layer, the higher order modes, which are not trapped by the core waveguide, will enter in the substrate from the beginning. For structure d) with adjacent trapping waveguide, it expected very high overlap of the fundamental mode of the main structure with fundamental mode of the modified structure and low overlap between the fundamental mode and higher order modes.

Figure 8:
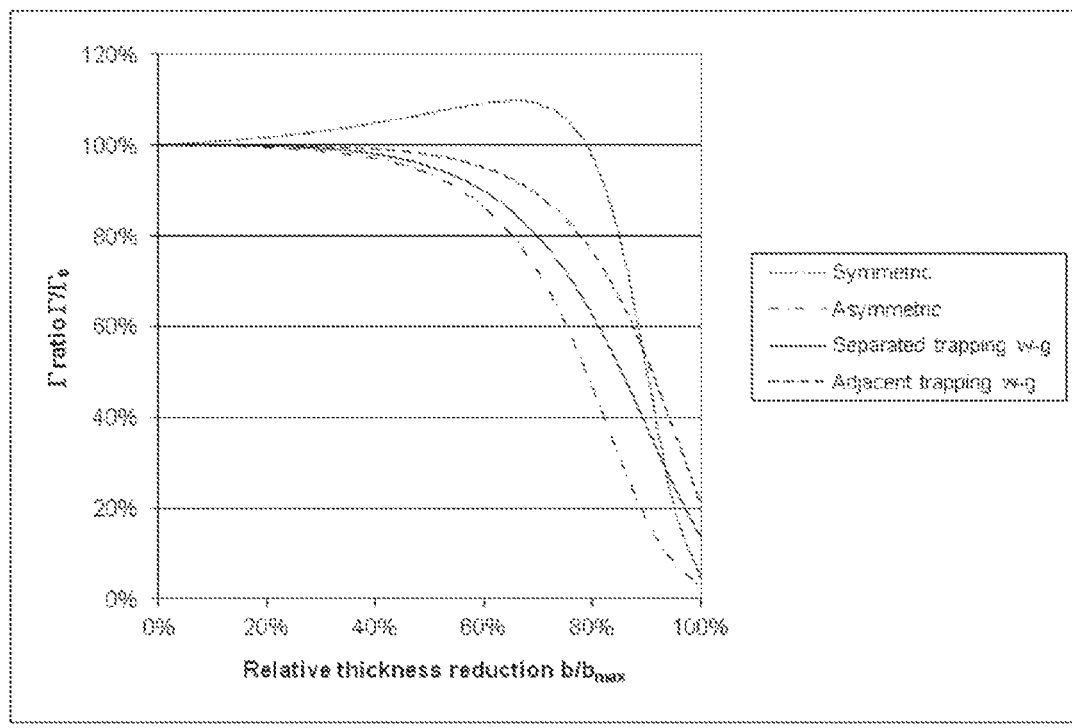
FIG. 8 shows the dependence of the confinement factor $\Gamma$ of the fundamental transversal mode for 4 structure examples on the relative thickness reduction $b_{rel}$ of their upper cladding.
Figure 9A:
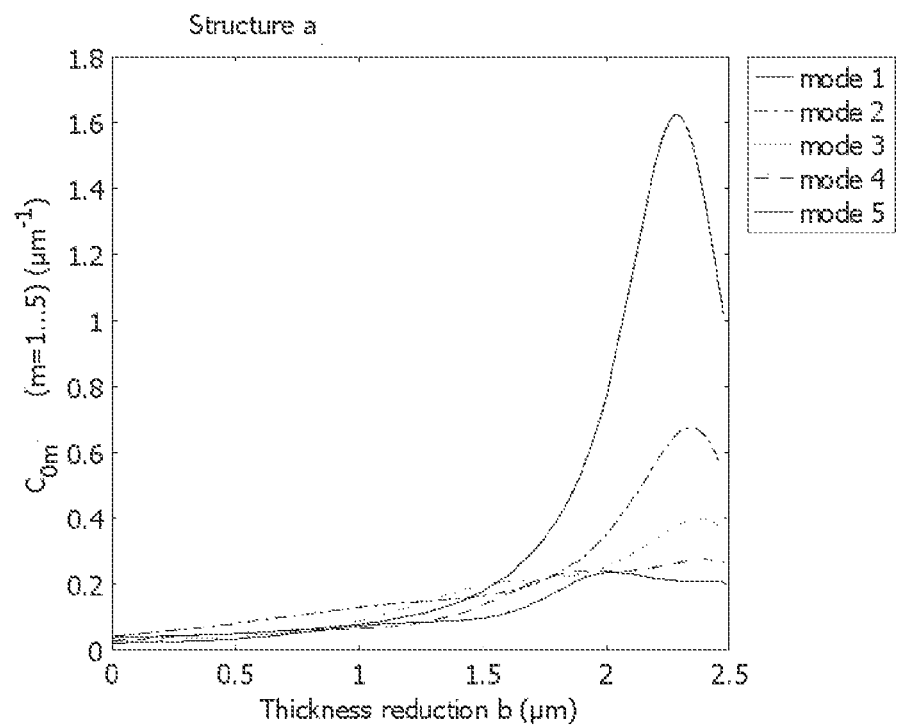
FIG. 9A shows the intrinsic coupling coefficient, $C_{0m}$, as a function of the thickness reduction b of their upper cladding with mode order m=1 . . . 5 as parameter for a symmetric structure.
Figure 9B:
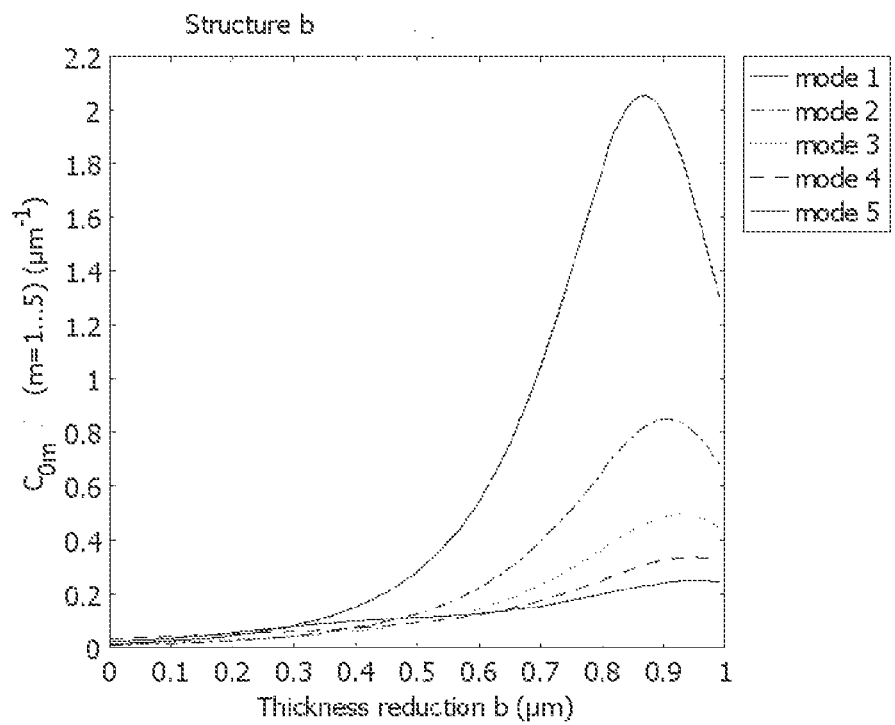
FIG. 9B shows the intrinsic coupling coefficient, $C_{0m}$, as a function of the thickness reduction b of their upper cladding with mode order m=1 . . . 5 as parameter for a structure with the lower cladding refractive index higher than the upper cladding refractive index.
Figure 9C:
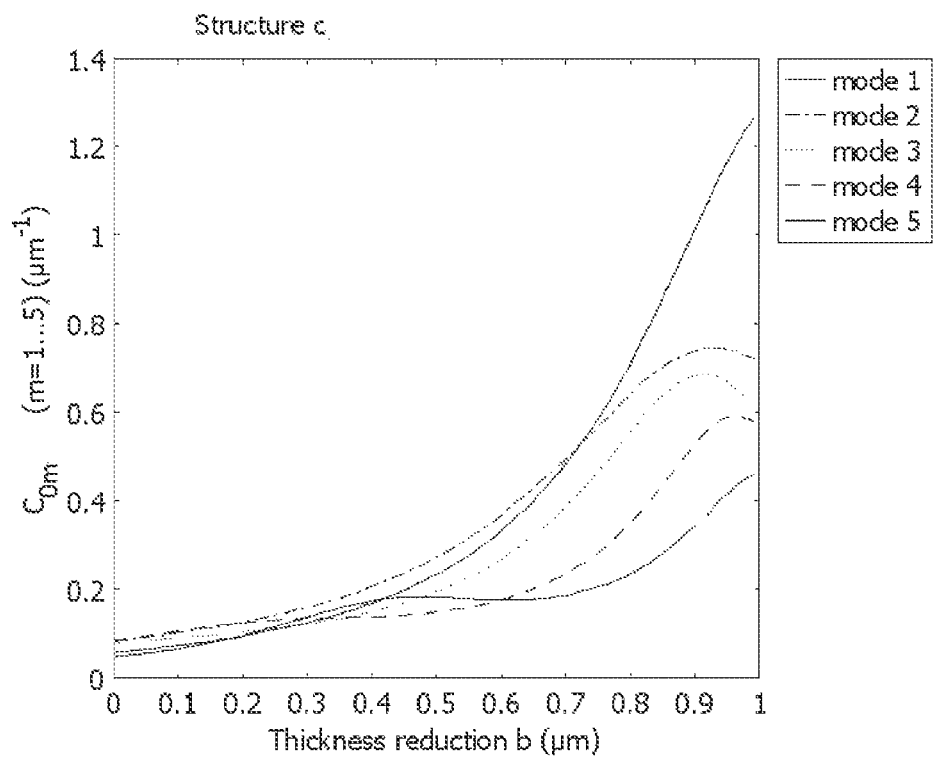
FIG. 9C shows the intrinsic coupling coefficient, $C_{0m}$, as a function of the thickness reduction b of their upper cladding with mode order m=1 . . . 5 as parameter for a structure with a secondary trapping waveguide separated from the core waveguide by a separation layer.
Figure 9D:
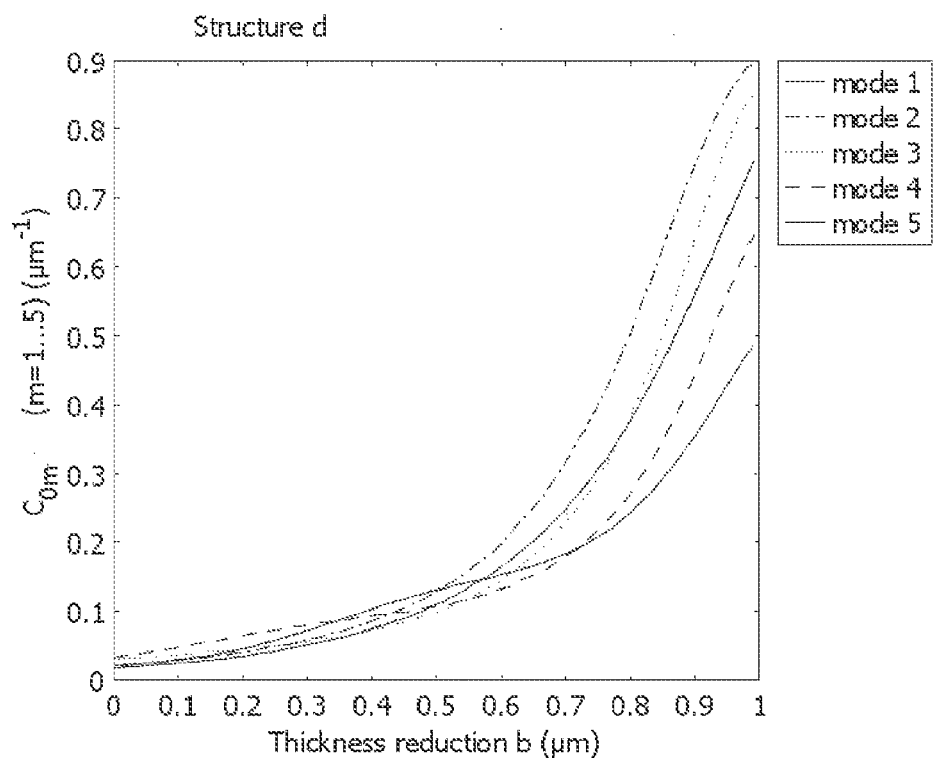
FIG. 9D shows the intrinsic coupling coefficient, $C_{0m}$, as a function of the thickness reduction b of their upper cladding with mode order m=1 . . . 5 as parameter for a structure with a secondary trapping waveguide adjacent to the core waveguide.
Figure 10A:
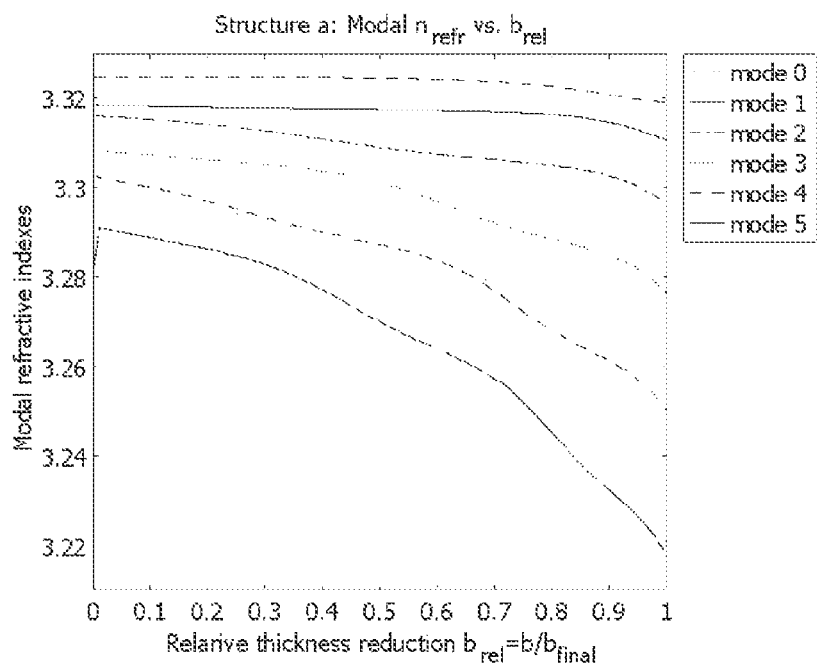
FIG. 10A shows the modal refractive index, $n_m$, as a function of the thickness reduction b of their upper cladding with mode order m=0 . . . 5 as parameter for a symmetric structure.
Figure 10B:
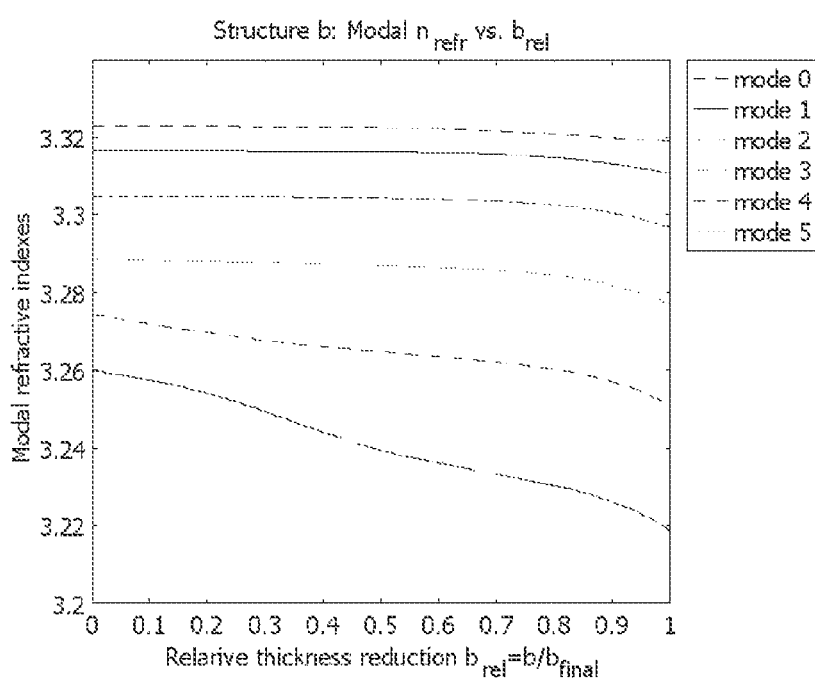
FIG. 10B shows the modal refractive index, $n_m$, as a function of the thickness reduction b of their upper cladding with mode order m=0 . . . 5 as parameter for a structure with the lower cladding refractive index higher than the upper cladding refractive index.
Figure 10C:
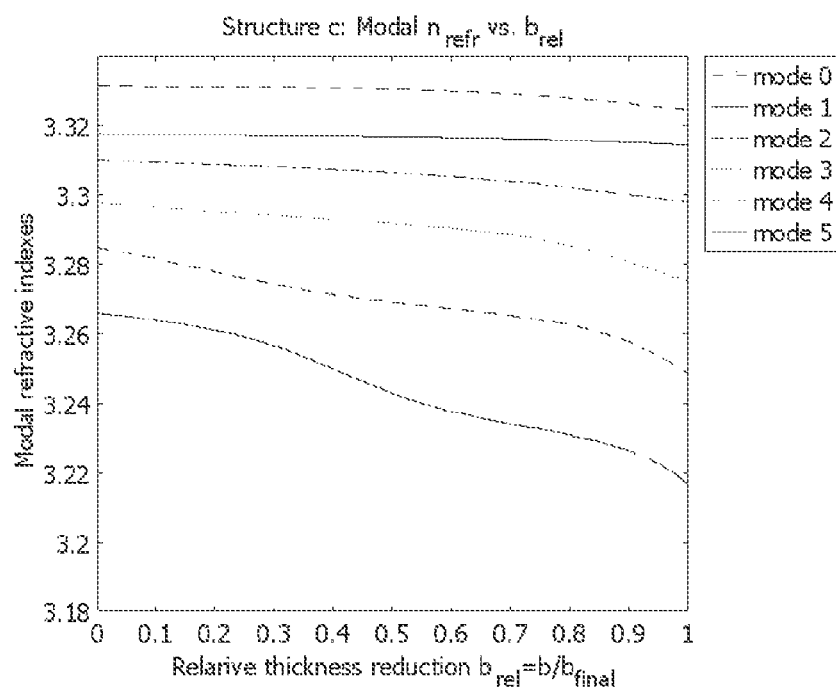
FIG. 10C shows the modal refractive index, $n_m$, as a function of the thickness reduction b of their upper cladding with mode order m=0 . . . 5 as parameter for a structure with a secondary trapping waveguide separated from the core waveguide by a separation layer.
Figure 10D:
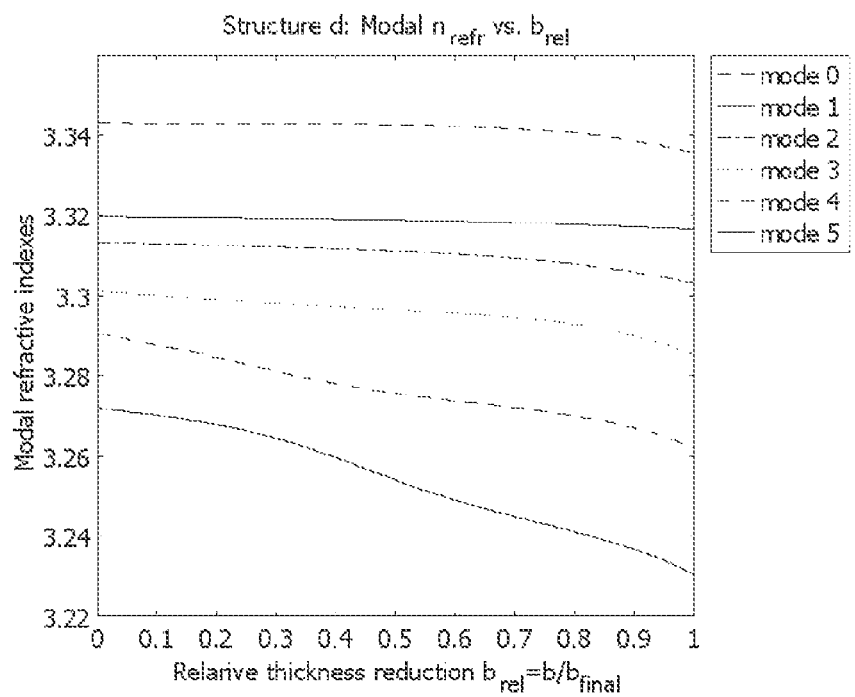
FIG. 10D shows the modal refractive index, $n_m$, as a function of the thickness reduction b of their upper cladding with mode order m=0 . . . 5 as parameter for a structure with a secondary trapping waveguide adjacent to the core waveguide.
Figure 11A:
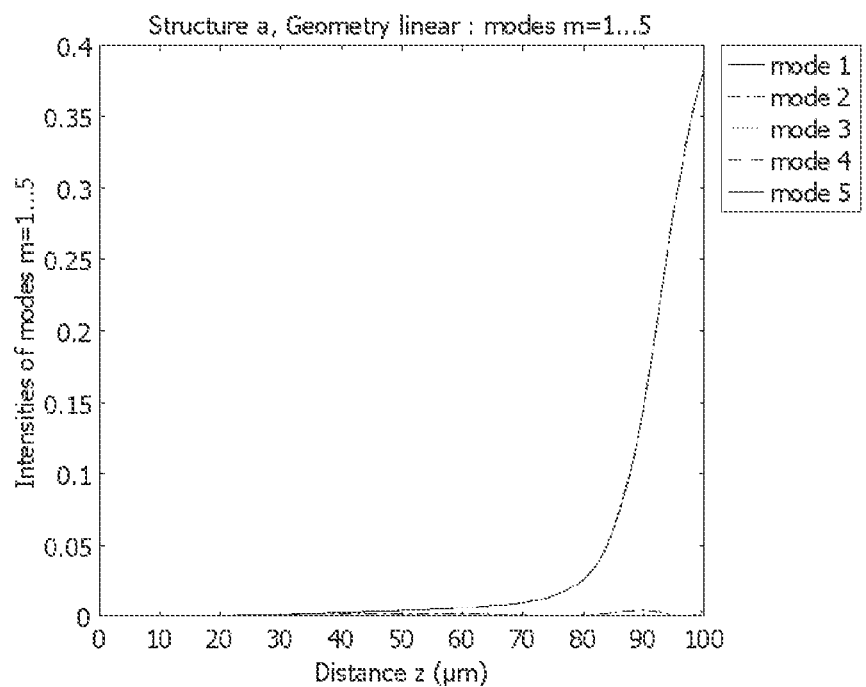
FIG. 11A shows the variation of fundamental mode intensity with the horizontal taper distance z, for a linear vertical taper, with mode order m=1 . . . 5 as parameter for a symmetric structure.
Figure 11B:
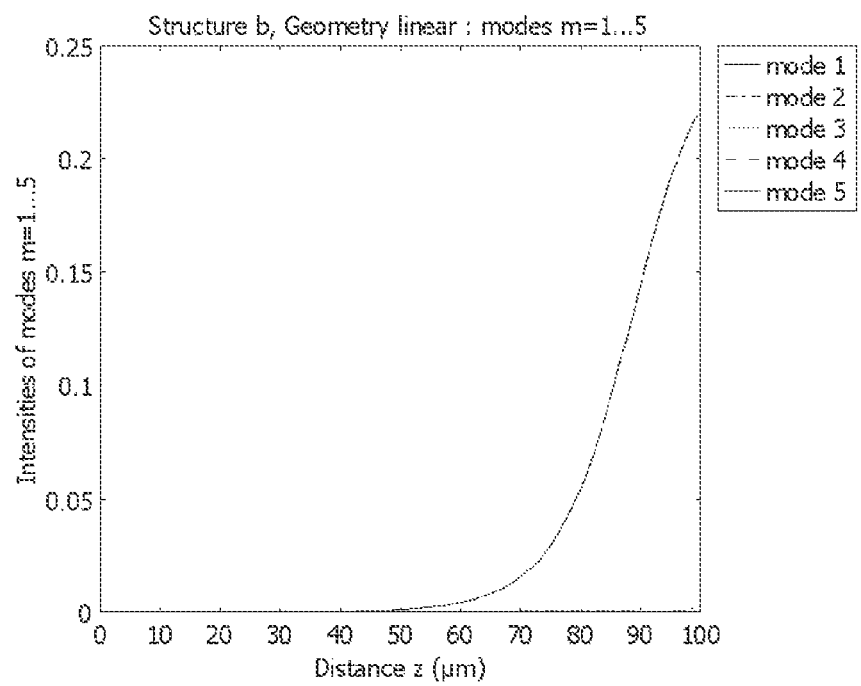
FIG. 11B shows the variation of fundamental mode intensity with the horizontal taper distance z, for a linear vertical taper, with mode order m=1 . . . 5 as parameter for a structure with the lower cladding refractive index higher than the upper cladding refractive index.
Figure 11C:
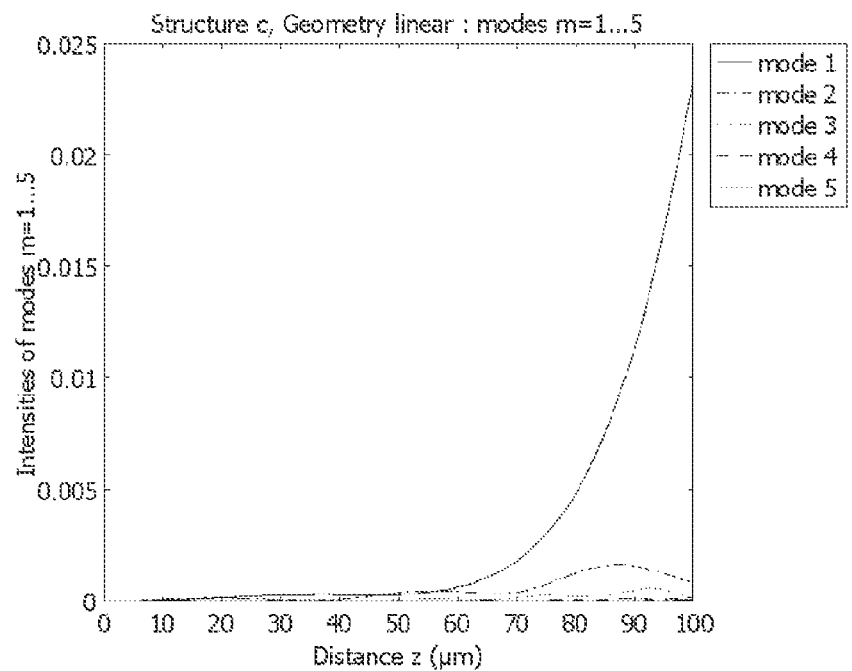
FIG. 11C shows the variation of fundamental mode intensity with the horizontal taper distance z, for a linear vertical taper, with mode order m=1 . . . 5 as parameter for a structure with a secondary trapping waveguide separated from the core waveguide by a separation layer.
Figure 11D:
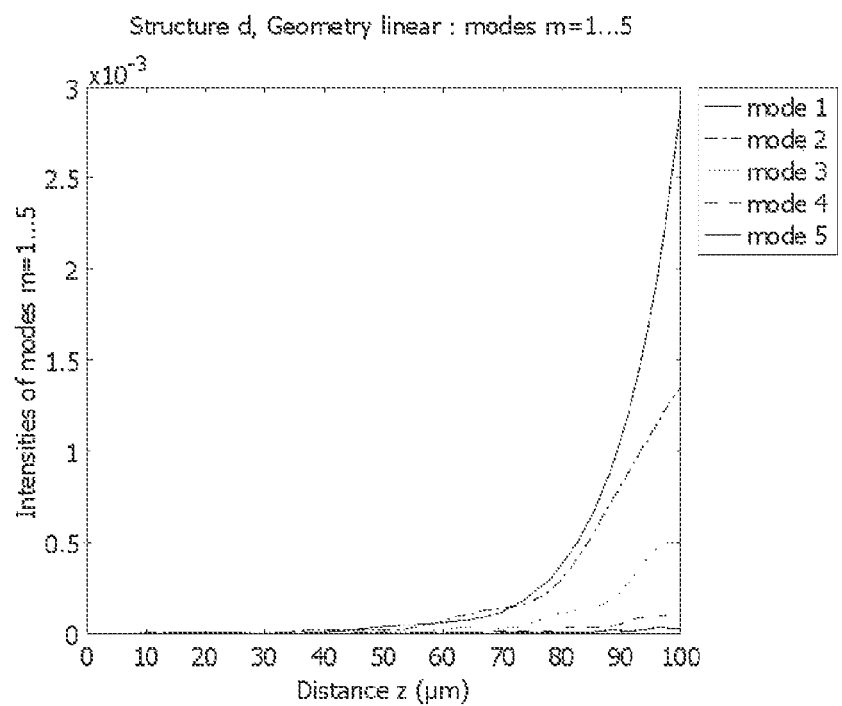
FIG. 11D shows the variation of fundamental mode intensity with the horizontal taper distance z, for a linear vertical taper, with mode order m=1 . . . 5 as parameter for a structure with a secondary trapping waveguide adjacent to the core waveguide.

The important consequence of the field shift from the upper cladding side to the lower cladding side, shown in FIGS. 7A-7D, is the reduction of the confinement factor $\Gamma$. FIG. 8 summarize the reduction of the confinement factor as a function of the relative cladding thickness reduction $b_{rel}=b/b_{final}$. The confinement factor reduction is expressed as the ratio $\Gamma/\Gamma_0$, where $\Gamma_0$ is the fundamental mode confinement factor for unmodified main segment structure 20. Considering that thickness is modified by etching, b is the etch depth in the upper cladding layer 3. For structures b)-d) these dependences are similar. The asymmetric structure b) shows the most sensitivity of $\Gamma$ vs. $b_{rel}$. For structure a), the confinement factor first increases, due to the reduction of the field distribution in the upper cladding 3, without a complementary extension in the lower cladding 2. The eventual decrease in $\Gamma$ is coincident with the moving of the field distribution from the core waveguide to the lower cladding 2. All structures show a drop of $\Gamma/\Gamma_0$ ratio down to values 0.1-0.2, which mean the possibility to increase the resilience of windows against degradation by a factor between ×5 and ×10, or more.

FIGS. 9A-9D show the dependences of intrinsic coupling coefficients $C_{0m}$, of the fundamental mode with higher order modes, with m=1 . . . 5, on upper cladding 3 thickness reduction b for all four structures. The curves for the coupling $C_{01}$ from the fundamental mode to the 1$^{st}$ order mode have the $b_{rel}$ range of efficient coupling that has a width roughly equal to 40% . . . 50% of $b_{rel,max}$. This width corresponds with the observed $b_{rel}$ range for significant change in the shape of the fundamental mode field distributions and with the $b_{rel}$ range for confinement factor $\Gamma$ falling. In the case of symmetric structure, the curves are extended over 2.5 µm. In the case of asymmetric structure b), the coefficient $C_{01}$ has the highest value among $C_{01}$ values in all other cases. These facts will influence in a negative manner the possibility to temper the transfer losses of the fundamental mode in vertical tapered end segments, since, in a rough approximation, this possibility is determined by the area under the C curves.

The values for $C_{0m}$ in FIGS. 9A-9D are rather high values. They are equal to the K coefficients for an abrupt vertical taper with the slope sl=2.5 for structure a) and sl=1 for structures b), c) and d). To avoid high transfer losses these values should be diluted using a slower vertical taper, for example with sl=0.025 for structure a) and sl=0.01 for structures b), c) and d). In this case, the taper should be 100 µm long to decrease b from the initial value to zero. A taper that long will allow the back coupling of power transferred to higher order modes since its length is of the same order of magnitude as the coupling length periods among modes.

FIGS. 10A-10D show the dependences of modal refractive indexes for all modes with m=0 . . . 5 on upper cladding thickness reduction $b_{rel}$ for all 4 structures. These curves are an essential part of the behavior of the coupling along the end segment. It should be noted that the highest difference between fundamental mode refractive index and the 1$^{st}$ order refractive index is for structure d), which has a wide passive waveguide adjacent to the active waveguide.

FIGS. 9A-9D and FIGS. 10A-10D contain the data necessary for evaluation of the transfer losses from the fundamental mode to higher order modes along a vertical tapered end segment, an end segment that has a plurality of steps. For an initial comparison, the transfer losses were estimated in similar conditions, namely an end segment 100 µm long with the drop of the upper cladding layer from the initial thickness to the final thickness of 0.01 µm and with constant slope sl=0.025 for structure a) and sl=0.01 for structures b), c) and d). The field amplitudes $a_j$ interconnected by equations (5) determines the evolution of the transfer losses to higher order modes. The evolution was evaluated assuming that at the entrance in the end segment $a_0=1$ and $a_m=0$ for m=1 . . . 5. Coupling to modes of order higher than m=5 was neglected. It is shown in these estimations that the coupling to higher order modes decreases very fast as the mode order increases. Losses toward higher modes $L_j$ and losses from the fundamental mode $L_0$ were calculated as:

$$L_j = |a_j|^2 \quad j \neq 0 \qquad (6a)$$

$$L_0 = 1 - \Sigma_{j \neq 0} |a_j|^2 \qquad (6b)$$

FIGS. 11A-11D show the evolution of the intensities of modes of order m=1 . . . 5, along the distance z of the end segment for all four structures, relative to the intensity of the fundamental mode 0, which, when this mode entered the end segment, is $a_0^2=1$. Not all modes are visible on the linear scale in these figures. For the case of structure d), the structure without separation layer and having a wide passive waveguide adjacent to the core waveguide, up to three modes are clearly visible. This is the structure where the coupling to mode 1 is an order of magnitude lower than for the other cases and with the highest refractive index between the fundamental mode and the 1$^{st}$ order mode.

In general, the smaller intensity of 2$^{nd}$ order mode compared with the intensity of the 1$^{st}$ order mode is due, firstly, to its lower intrinsic coupling coefficient with fundamental mode and, secondly, to the shorter coupling period $L_{02}$ of the 2$^{nd}$ mode compared with the coupling period $L_{01}$ of the 1$^{st}$ mode. It is known that the amplitudes of higher order modes with the fundamental mode have a variation similar with a periodic behavior, with the period approximately equal to:

$$L_{0m} = 2\pi/(\beta_0 - \beta_m) = \lambda/(n_0 - n_m) \qquad (7)$$

These periods are not constants since refractive index differences depend on b, as shown in FIGS. 9A-9D, and implicitly on z. The coupling periods $L_{0m}$ are shorter for higher m values. The periodic behavior of higher order modes intensity reflects the coupling forth and back for any pair of modes. These periodic variations have the consequence that the maxima $M_m$ of modal intensity variations are, if interactions other then interaction with the fundamental mode are neglected, approximately given by:

$$M_m \approx |4C_{0m}L_{0m}|^2 = |4C_{0m}\lambda/(n_0-n_m)|^2 \qquad (8)$$

The last formula shows why the coupling of the fundamental mode with higher order modes decreases very fast as the mode order number increases. This statement is true for any pair j and k. Both contributing factors to transfer maxima values, $C_{jk}$ and $L_{jk}$, decrease as the difference between the order numbers j and k increases.

Figure 12:
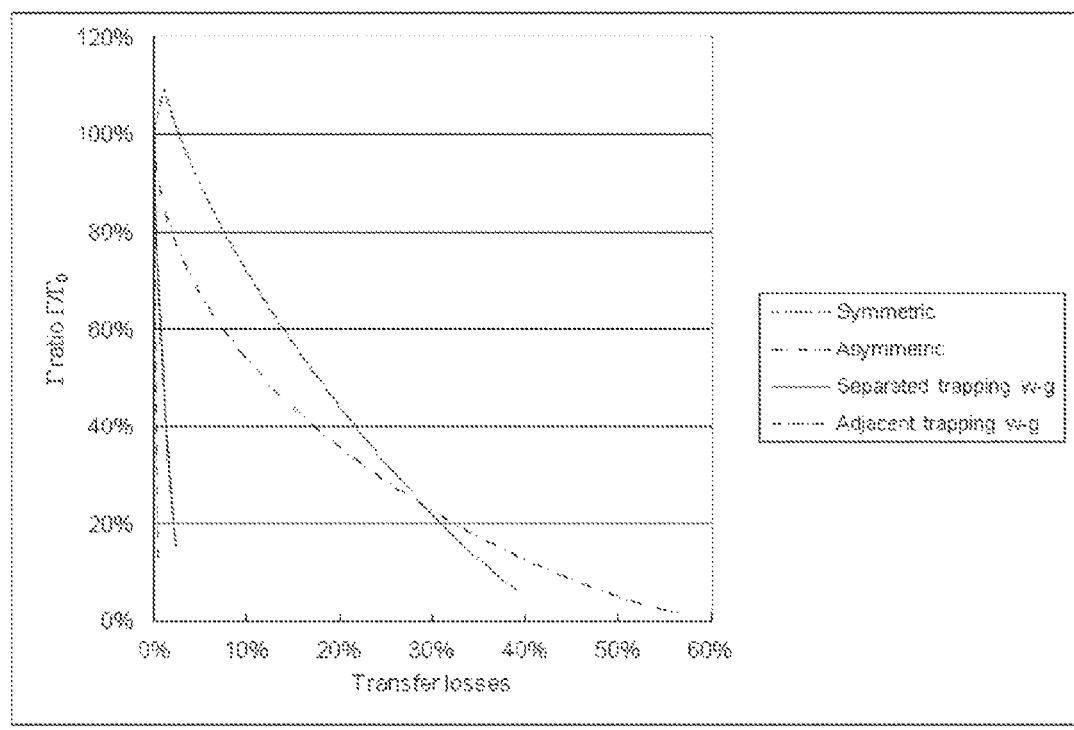
FIG. 12 shows the variation of the fundamental mode transfer loss with the horizontal taper distance z, for four transversal structure examples and for a linear vertical taper.
Figure 13A:
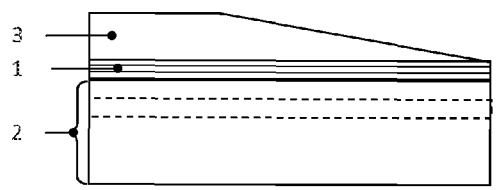
FIG. 13A shows schematically a continuous linear geometry for the end segment vertical taper.
Figure 13B:
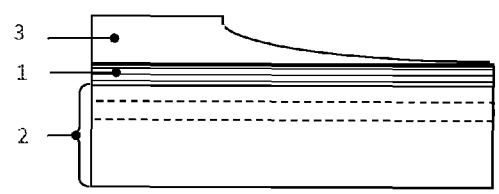
FIG. 13B shows schematically a continuous exponential geometry for the end segment vertical taper.
Figure 13C:
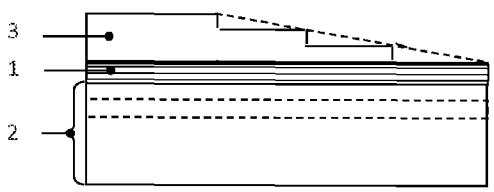
FIG. 13C shows schematically a quasi linear geometry for the end segment vertical taper.
Figure 13D:
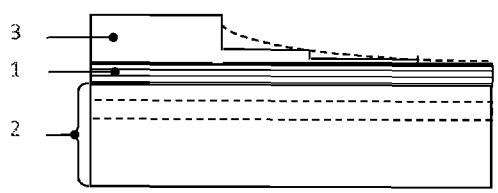
FIG. 13D shows schematically a quasi exponential geometry for the end segment vertical taper.

FIG. 12 shows the fundamental mode loss in a linear vertical taper 100 µm long for structures a), b), c) and d). For a common $\Gamma/\Gamma_0$ ratio of 20%, structure d), the structure without separation layer between a wide passive trapping waveguide adjacent to the active waveguide, has the lowest maximum transfer loss, 0.5%. The structure c), that with a separated trapping waveguide, has similar performance. The structure a), symmetric, and b), asymmetric and without a trapping waveguide, have a rather high transfer loss value 30%. This value might be reduced by a longer taper. FIG. 12 shows that end segments with vertical tapers can substantially reduce the transfer losses to higher order modes in comparison with end segments with a single step presented in FIG. 3. It also shows that the best candidates for this accomplishment are structures with double waveguides.

Additional characteristic parameters of each structure are given in short in Table 2. These parameters are the optical measure OM of the core waveguide, or core & trapping waveguide, the average ratio of the $1^{st}$ order confinement factor $\Gamma_{1st}$ relative to the fundamental mode confinement factor $\Gamma$ and total thickness of the basic structure.

TABLE 2

Additional characteristic parameters of the example epitaxial structures

| Structure | OM | $\Gamma_{1st}/\Gamma$ | Structure Thickness (µm) |
|---|---|---|---|
| a) symmetric | 0.25 | 0.5 | 5.7 |
| b) asymmetric w/o trapping w-g | 0.26 | 0.4 | 4.2 |
| c) separated trapp. w-g | 0.51 | 0.30 | 4.2 |
| d) adjacent trapp. w-g | 0.89 | 0.23 | 4.7 |

FIGS. 9A-9D and FIGS. 10A-10D, from where the FIGS. 11 and 12 are derived, are the key features for evaluating the suitability of the transversal structures for being used for mirror protection using a vertical tapered end segment with very low $\Gamma$ values at the segment end. For an end segment with constant slope of the vertical taper, the preferred transversal structures are the structures with double waveguide. The transversal structures are the first building block for the achievement of efficient devices according with the objective of this invention. The second building block is the longitudinal geometry of the vertical taper of the end segment and it should be evaluated too, in order to keep the transfer losses to higher order modes at very low values or to obtain low values with simplified geometries.

Examples of Geometries for the Vertical Taper

Vertical tapers were evaluated with the use of the structure c) for four different geometries with gradual decrease of the upper cladding 3 thickness (the key wording for these structures are in italics):

1) *continuous linear* vertical taper geometry with constant slope sl (evaluation completed in the last section);
2) *continuous exponential decay* vertical taper geometry;
3) *quasi linear* vertical taper geometry with few steps, having equal depths and equal treads;
4) *quasi exponential* vertical taper geometry with a few steps.

FIG. 13 shows schematically these four geometries for the end segment vertical taper. For the quasi linear and quasi exponential tapers, dashed lines were added to visually help the reader.

These geometries are characterized by the shape of functions sl(z). Table 3 describes these functions. In these examples, the continuous tapers have length equal to 100 µm, and the stepped tapers have the position of the last step at a distance smaller than 100 µm. The vertical taper geometries are evaluated only for structures c), one of the best candidates for structures with end segments. The exponential taper 2) is steeper at the beginning of the end segments and less steep towards the exit end. Such a slope function for vertical taper 2) would make the product $C_{01}(z)sl(z)$ more uniform and will reduces transfer losses relative to the linear taper, for equal length tapers. The quasi-exponential taper 4), with only three steps, roughly simulate the exponential decay taper. The steps are deeper at the beginning of end segment and shallower toward the end. The positions of these steps along the end segment are selected for minimum transfer losses. The selection takes advantage from the back coupling of higher order modes to the fundamental mode when sufficiently propagating along the length of the end segment. An algorithm calculates for a first etch depth, the z position that corresponds to a loss minimum where the beginning of the second step would be located. At this position, the second etched step starts and ends at the z position of new loss minimum, etc. The quasi-linear tapers 3a) and 3b) have ten and three steps, respectively. The steps are equal distanced and have equals risers.

TABLE 3

Characteristic slope function for gradual decrease of upper cladding layer thickness

| Vertical taper name | length L (µm) | slope function sl(z) (with condition: $\int_0^L sl(z)\,dz = b_{max}$; $b_{max} = 1$ µm) |
|---|---|---|
| 1) linear (in last section) | 100 | $b_{max}/L$ |
| 2) exponential | 100 | $39.8\, b_{max}/L \exp(-3.875\, z/L)$ |
| 3a) 10 steps quasi linear | <100 | $\Sigma_n^{10} a_n\, b_{max}/L\, \delta(z - l_n)\; a_n = 10;$ $l_n = (1 + 10 \times n)$ µm; |
| 3b) 3 steps quasi linear | <100 | $\Sigma_n^{3} a_n\, b_{max}/L\, \delta(z - l_n)\; a_1 = 33;\, a_2 = 33;\, a_3 = 33;$ $l_1 = 1$ µm; $l_2 = 34$ µm; $l_3 = 67$ µm; |
| 4) 3 steps quasi exponential | <100 | $\Sigma_n^{3} a_n\, b_{max}/L\, \delta(z - l_n)\; a_1 = 75;\, a_2 = 15;\, a_3 = 10;$ $l_1 = 1$ µm; $l_2 = 22$ µm; $l_3 = 46$ µm; |

In practice, it is preferable to replace a gradual, but continuous reduction of the height h of the upper cladding with a gradual, but discrete reduction in h. A stepped geometry is more easily implementable. If the number of steps is high enough, say about ten, the transfer losses are almost equal to those of continuous geometries. It is more preferable that the number of steps be a smaller number. With only three steps, the transfer losses can be reduced to acceptable values in the case of 3-steps quasi-exponential taper.

Figure 14:
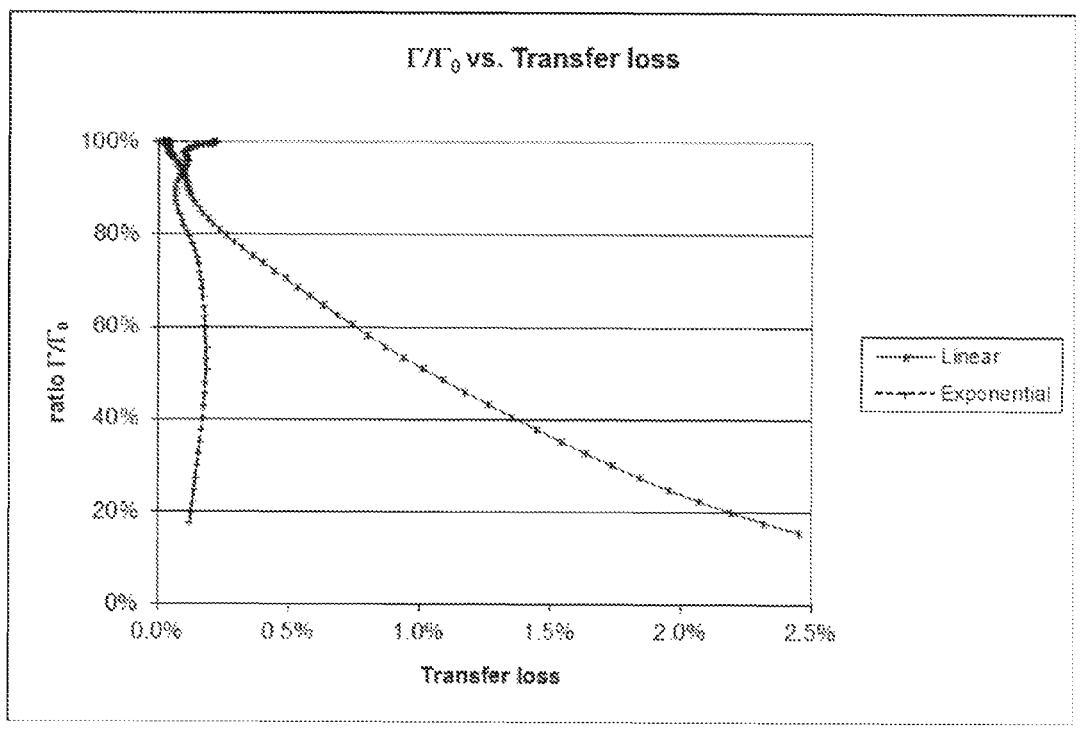
FIG. 14 shows the relative $\Gamma/\Gamma_0$ ratio vs. the transfer loss for linear and exponential tapers.

FIG. 14 shows a comparison between the linear taper 1) and the exponential taper 2). The curve for the linear taper is continuously descending. The maximum reduction b of the upper cladding layer thickness is reached at the end of the taper. The $\Gamma$ values reach their minimum and the transfer losses their maximum value of 2.5%. Transfer losses less than 10% would be still acceptable for a practical device. The markers on curves indicate the values along the taper, at 1 μm intervals. The marker's positions show that the variations are greater at the end of the taper. The greater variations at the end of taper are related to the greater variations with b of both $\Gamma$ factor and transfer losses L, shown in FIG. 8 and, respectively, in FIGS. 11A-11D.

The exponential taper 2) has oscillating transfer losses L while the $\Gamma$ factor is continuously decreasing. The oscillations are explainable by the periodic dependences of transfer losses to higher order modes, each of these dependences with its period. The periodic dependencies become easier visible due to the more abrupt slope at the beginning of the taper. At the beginning, transfer losses reach a relative high value, almost with no fall in $\Gamma$ factor. From that point, the transfer loss oscillations keep the overall transfer loss to a remarkably low value, smaller than 0.3%. This value is very small given that transfer losses less than 10% would be still acceptable for a practical device.

Figure 15:
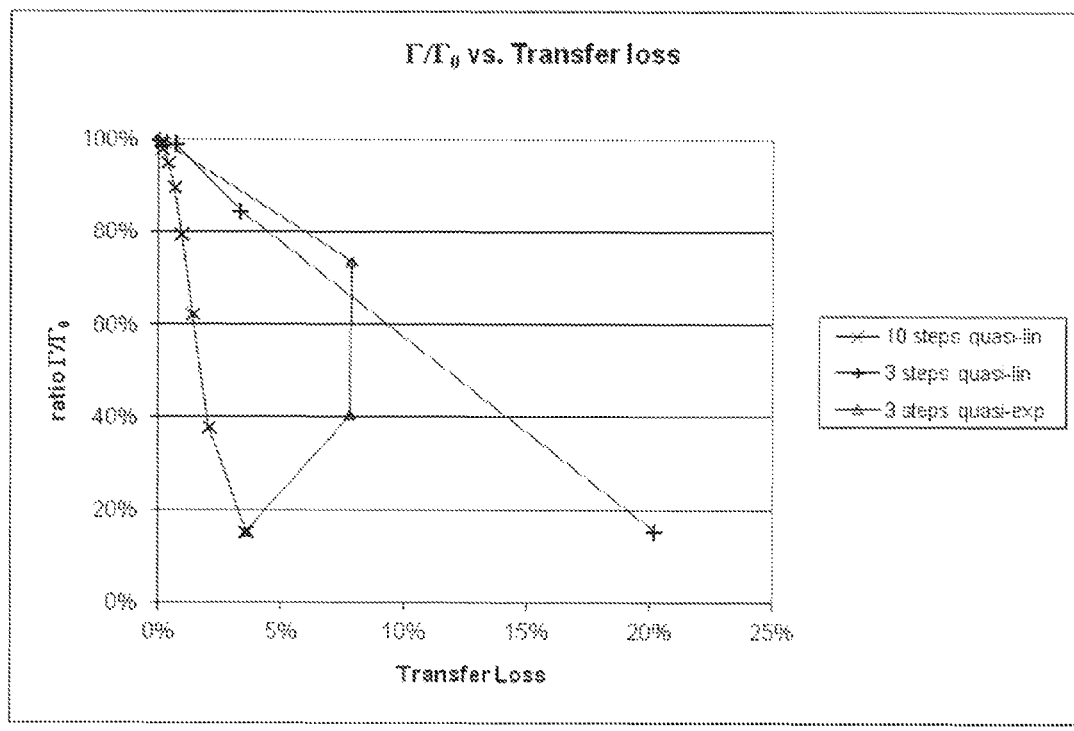
FIG. 15 shows the relative $\Gamma/\Gamma_0$ ratio vs. the transfer loss for 10 steps quasi-linear, 3 steps quasi-linear and 3 steps quasi-exponential tapers.

FIG. 15 shows the comparison between a ten steps quasi-linear taper 3a), a three steps quasi-linear taper 3b) and a three steps quasi-exponential taper 4). The shapes of the quasi-linear taper 3a) and 3b) are very similar to the shape of the linear taper, but with approximately 1.4× and, respectively, 10× increase of the transfer loss. For the quasi-linear tapers, the markers in FIG. 15 correspond to steps positions at 10 μm intervals and, respectively, at 33 μm intervals. When the distances between steps are equal, both the variations of confinement factor ratio and that of transfer losses are greater toward the last step.

For the quasi-exponential taper, the steps are chosen at 1 μm, 22 μm and 46 μm by an algorithm that minimize the final transfer loss by optimally taking the advantage for loss reduction due to the inherent existence of phase differences for any new coupling at each step. Very low transfer losses can be obtained when, arriving at a step, the fundamental mode has phase difference close to $\pi$ rad relative to one or more higher order modes already propagating. The higher order modes already propagating can be compensated by the same order modes newly coupled at the step. In FIG. 15, this is happening at the last step, which corresponds to the last marker of the quasi-exponential taper 4). The large oscillation in transfer loss is helped by the deep value of the first step riser, which has a similar role with the steeper slope of the exponential taper at the beginning of the end segment. FIG. 15 shows that relatively low transfer losses, less than 4%, can be obtained in a taper with only three steps, if steps are well designed, both in selection of the step depth and distance between steps. This small 4% transfer loss accompanies the 5× decrease of the $\Gamma$ factor, i.e. the 5× increase of the window resilience against degradation. Transfer losses less than 10% would be still acceptable for a practical device.

The ten steps quasi-linear taper and the well designed three steps quasi-exponential taper have in the end similar transfer losses, with a similar benefit in $\Gamma$ factor reduction. Nevertheless, the imprinting of 10 steps, or more, on a wafer is also, if not difficult, a tedious endeavor. The success of the well-designed tree steps taper depends not only on the algorithms for finding the values of step riser and of their positions, but also on the execution of the initial epi structure, relative to its geometrical and optical properties.

It should be noted that the refractive index variation for the first step of vertical taper 4), with $b_1=0.75$ μm and $h_1=0.26$ m, is equal to $\Delta n=0.0026$. If used laterally to a ridge structure, index variations of this order of magnitude can be used for obtaining single mode operation of the ridge that has an end segment. Such a ridge, surrounded by a layered structure with the same upper cladding height $h_1$, is in fact a mesa structure.

Figure 3:
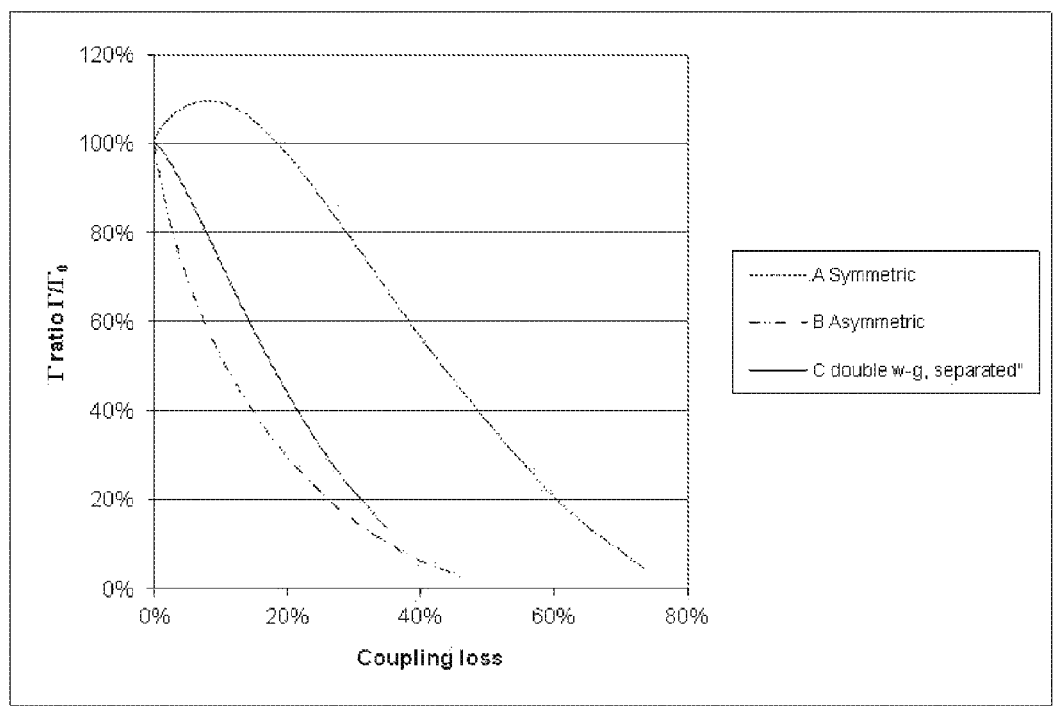
FIG. 3 illustrates the dependence of the confinement factor reduction, $\Gamma/\Gamma_0$, on the coupling losses, for a symmetric structure (A); an asymmetric structure with the refractive index higher in its lower cladding than in its upper cladding (B); and a structure with a secondary trapping waveguide included in the lower cladding and separated from the core waveguide by a separation layer (C).

Note that FIG. 3 represents the ratio $\Gamma/\Gamma_0$ associated with a single etch step and the associated losses for each depth value. FIGS. 14 and 15 represent the ratio $\Gamma/\Gamma_0$ vs. associated transfer loss, corresponding to a plurality of etch depths at a plurality of position z in the end segment, which makes an either continuous or a stepped vertical taper. The final values for $\Gamma/\Gamma_0$ ratio and for the transfer losses are attained at the end of the entire end segment taper. To reach the same final $\Gamma/\Gamma_0$ ratio, the associated losses are more than 40% for the case with a single etch, while for the tapered end segment they are only a few percents.

The preferred geometries of the vertical taper for the attainment of lowest transfer losses from the fundamental modes are the continuous geometries, linear and exponential, the most preferred being the exponential continuous geometry. The preferred vertical taper with quasi-continuous geometry for attainment of reasonable transfer losses from the fundamental mode, but having a simple geometry obtainable in a simple process, are the quasi-exponential geometry taper with a few steps and the quasi-linear with about ten steps. These geometries show that the <=100 μm vertical tapers, can be used to reduce the confinement factor with more than 5×, in the mean time assuring the transfer losses from the fundamental mode to less than 4%.

End Segments Included to MultiMode Semiconductor Laser

Constructions with end segments can be applied primarily to Broad Area Lasers (BAL=Broad Area Lasers) with a single emitter (SE=Single Emitter). SE lasers have a stripe, consisting of a main segment stripe continued with end segments stripes. Active SE laser stripes are relatively large, tens microns wide. If several stripes with such widths are placed in a single device they form an array several mm wide. Wide semiconductor lasers support multiple lateral modes. Using end segments allows the increase of devices nominal power by a factor of 2 to 3, up to the rollover in the light-current characteristic, for the constructions essentially of the same length. The advantage of this construction is the increase of the main economic indicator expressed as the price per unit of power output, the price being essentially determined by the area or the total length of each device.

End segments can be obtained by etching the upper cladding layer to desired geometries. Etching is done in streets parallel to the direction of future cleaving directions. Semiconductor laser bars are obtained between two cleaving lines, bars which can be subsequently separated in semiconductor laser chips. Device width is defined between two successive separation lines in the longitudinal direction, perpendicular to the cleaving lines. Since the end segments are not necessarily identical for front and rear window, etching should be defined separately for each type of window. In the situation with this type of etching laser bars are placed "back to back" on wafer.

Sometimes it is also necessary to define laterally individual devices such as SE lasers by etching. Lateral definition can be done by lateral longitudinal stripes for lateral confinement. These confinement lateral stripes are obtained also by etching. A deep etching, lower than the last part of the end segment will confine the active stripe, including its end segment. To obtain uniform etched lateral confinement stripes, after the end streets were etched, an etch stop layer need to be included in the structure.

A sufficient refractive index difference can be obtained by rather shallow etching depth compared with the final etch depth of the end segment. The etching process can start with etching around a mesa SE stripe, followed by deeper etches for the final etching streets. In this case, longitudinal etching stripes optically confine only the active mesa stripes.

End Segments Included to Single Mode Semiconductor Laser

In the followings, a few examples will show the use of end segment for the exit windows of Single Mode (SM) semiconductor lasers. SM lasers operate in a single spatial mode. The simplest geometry for SM ridge lasers is the ridge geometry. In general, the width of SM ridge lasers must make a compromise between a high value, which ensures a better lateral confinement of the fundamental mode and lower lateral absorption, and a low value, which ensures the elimination or the prevention of operation in the $1^{st}$ order lateral mode.

Figure 16:
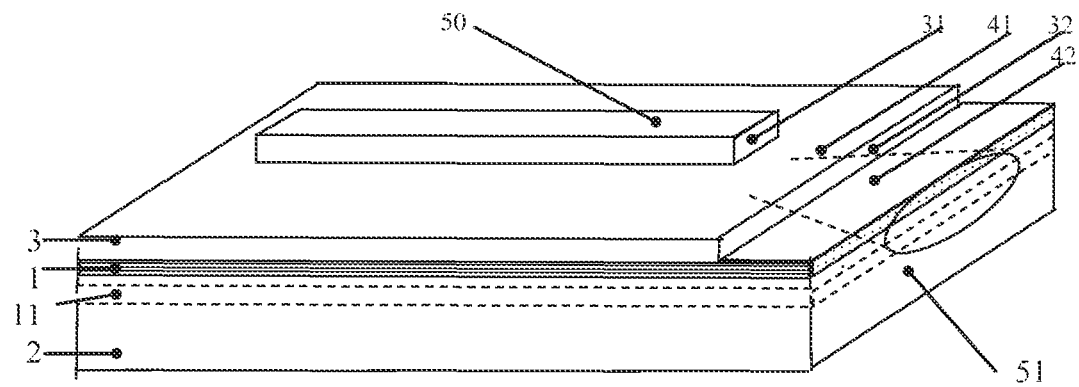
FIG. 16 shows a perspective view of a ridge-mesa structure with an end segment with two street steps in accordance with an embodiment of the invention.

FIG. 16 shows a ridge-mesa geometry where a ridge 50 is surrounded by a region 41 of lower upper cladding thickness, of lower effective refractive index and of lower confinement factor $\Gamma$ for the active region. The surrounded ridge is a mesa structure and can be obtained by a first etching process. The radiation excited under the ridge exits at a window facet 51. The difference between the effective refractive index of parts 50 and 41 assure the confinement of the lateral fundamental mode under the ridge. The ratio between the confinement factor $\Gamma$ of the active region under the ridge and in front of the ridge assures the increase in resilience toward the degradation of at the end facet 50. A secondary etched street step 42 increases this resilience with a supplementary factor. A multitude of secondary street steps are also possible to provide further increase in mirror resilience. For structures with double waveguide, after the confinement factor $\Gamma$ has been reduced 5 to 10 times, the etching of the active waveguide is also possible, the beam propagation continuing in the trapping waveguide.

Starting from the ridge output the radiation is expanded laterally within an angle which is dependent on the ridge width. By partial geometric reflection from the mirror, a reduced laser feedback is obtained. The beam expansion at the facet provides an supplementary factor in mirror protection. The end segments may play a supplementary role for filtering out the $1^{st}$ and higher order modes, since there is no confinement left and their larger lateral extension decreases their feedback compared with feedback reduction for the fundamental mode.

Figure 17:
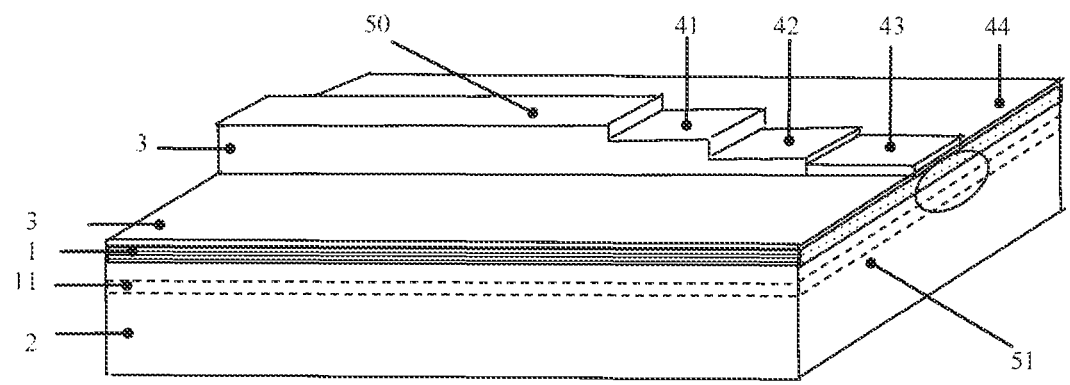
FIG. 17 shows a perspective view of a ridge structure continued in an end segment with three ridge steps in accordance with an embodiment of the invention.

FIG. 17 shows a ridge that continues along the end segment and consists of ridge treads 41, 42 and 43, formed by a single final lateral etch. The deep etching, lower than the last part 43 of the end segment, will confine the active ridge and the end segment stepped ridge. The last ridge step 43 of this ridge has a difference between its refractive indexes and the index of the lateral regions 44 that is adjusted for bounding only of the fundamental lateral mode. The difference between refractive indexes for the rest of the ridge may allow higher order lateral modes. The last ridge step 43 can play the role for filtering out higher order modes. To obtain uniform lateral confinement stripes after the end streets were etched, an etch stop layer need to be included in the structure.

Figure 18:
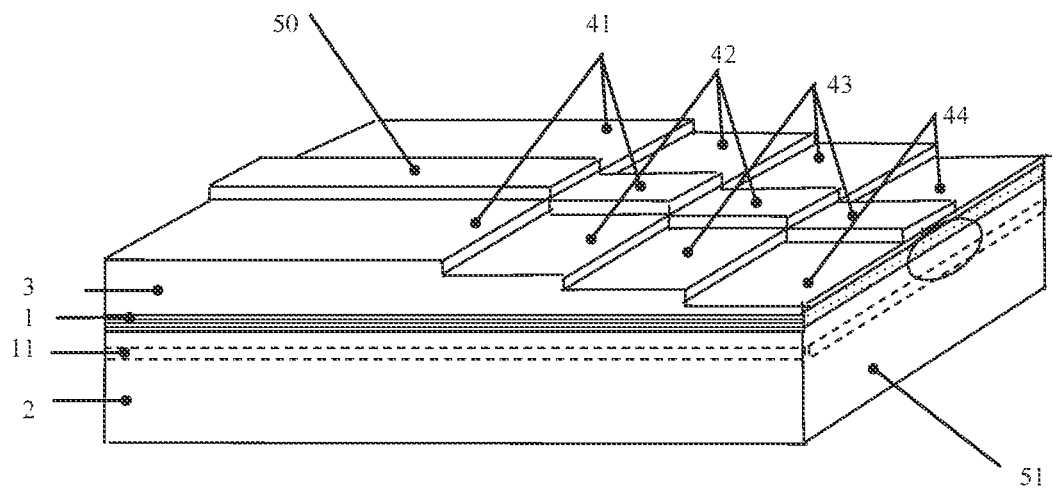
FIG. 18 shows a perspective view of a ridge structure with tailored three ridge steps in accordance with an embodiment of the invention.

FIG. 18 shows a ridge that better rejects high order lateral modes. Along the length of the end segment, at each step, this ridge is formed by smaller lateral reductions of the upper cladding 3. The thickness of the upper cladding for the structures lateral to the ridge decreases in steps to better confine the fundamental lateral mode. The fundamental lateral mode remains guided along the end segment when passing through consecutive ridge sections. This tailored etch process can start with the formation of mesa 50 surrounded by areas 41, followed by successive advancements of masks that form areas 42 around the section 41 of the ridge, then areas 43 around the section 42 of the ridge and finally areas 44 around the section 43 of the ridge.

Figure 19:
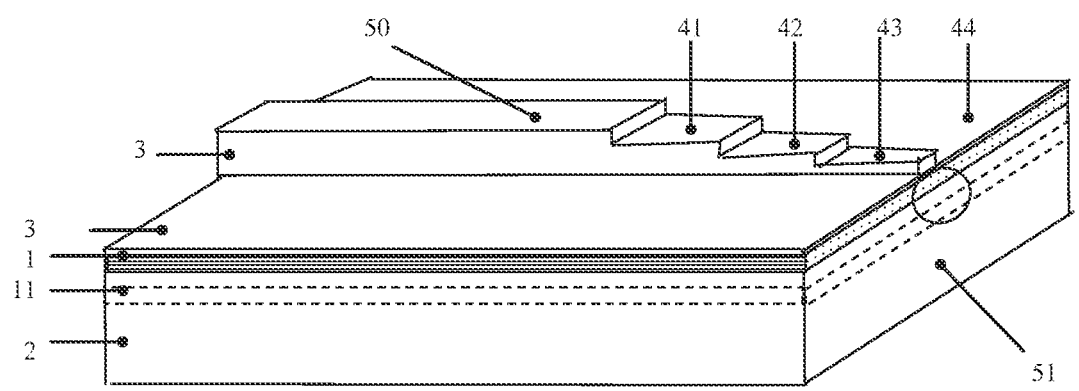
FIG. 19 shows a perspective view of a ridge structure with three ridge steps that form a narrowing horizontal taper in accordance with an embodiment of the invention.

FIG. 19 shows a narrowing lateral taper width that can be formed if the ridge section 41, 42, 43 have a reduced width toward the exit mirror. A reduced final width of the whole guided ridge, i.e., a laterally narrowing tapered ridge, can be used if the laser according to the invention has at the output an extremely low transverse confinement factor, which compensates the increased radiation concentration at the window and avoids the degradation induced by a narrower near field. If the aperture narrowing in the lateral y direction is up to the aperture value in the x direction, the laser can have an near field distribution at the output closer to a circular distribution, for a better butt coupling with fibers. A continuous graded vertical taper combined with a continuous lateral taper can be attained at the expense of more difficult technical effort.

Figure 20:
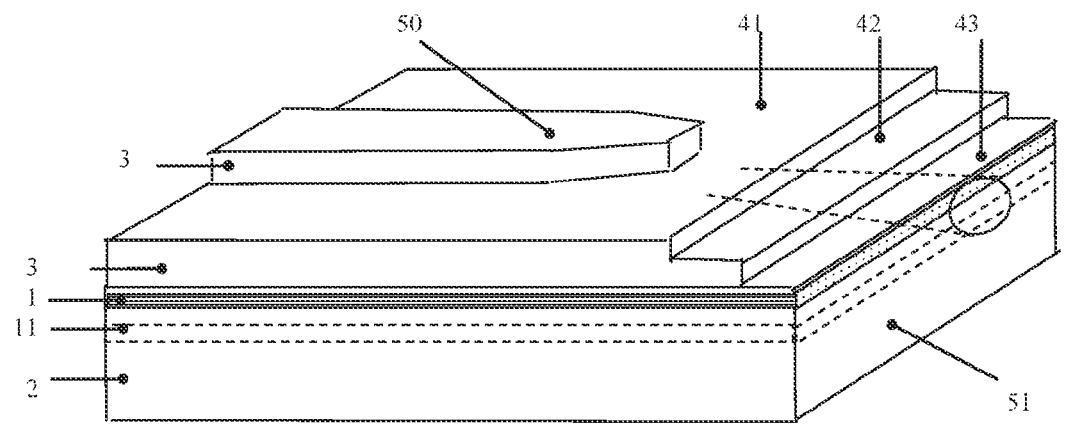
FIG. 20 shows a perspective view of a narrowing horizontal taper at the end of a mesa continued with an end segment with three street steps in accordance with an embodiment of the invention.

FIG. 20 shows a construction that use a wide ridge that ends with a horizontal narrowing taper. The taper can be so narrow to allow essentially only the exit of the fundamental lateral mode. The ridge continues with an end segment with a few street steps that drastically reduces the confinement factor of the fundamental transversal mode at the exit mirror 51 to compensate the increased radiation concentration at the window and to avoids the degradation induced by a narrower near field. Depending on the tapered ridge width at its end and on the length of the end segment, the exit spot with can be made narrower than the width of the wide ridge. Such a construction increases the pumped device area and the emitted power from a single spatial mode with an increased resilience to the COD.

Figure 21:
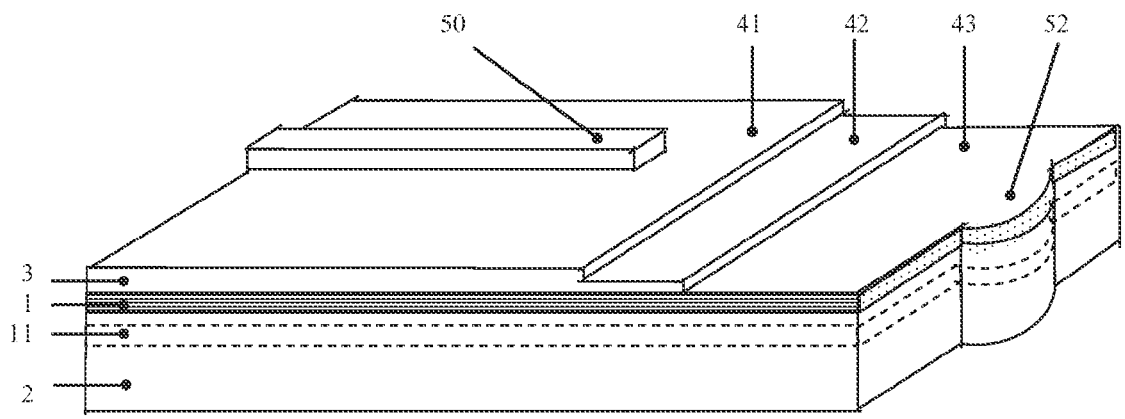
FIG. 21 shows a perspective view of an end segment terminated with an integrated lens in accordance with an embodiment of the invention.

It was observed before that the decrease of the fundamental mode confinement factor $\Gamma$ by a factor of 5 to 10 allows in the end the etching of the active region itself. Based on this observation is the structure depicted in FIG. 21. A cylindrical lens can be etched at the end of a device with double waveguide structure. The etching process can extend in the double waveguide without the danger of COD if the upper cladding was sufficiently reduced to avoid degradation at the etched surface induced by the etching process. Such a lens is useful for collimation or focusing the exit beam.

FIGS. 16-21 show different use of end segments at the exit facets. The same can be done at the rear mirror. The filtering action for the fundamental lateral mode of FIG. 16 and FIG. 17 can be used at the rear mirror too. At the rear mirror, a vertical expanding (from the mirror to the main segment) taper combined with a lateral expanding taper, can initiate the SM operation near the rear mirror and the expansion of this mode in the amplifying main segment, with a larger width and a greater fundamental transversal mode confinement factor Γ. This arrangement can provide high power SM devices with clean farfield.

End Segments Included for Distributed Bragg Reflectors

The last step of a step structure as that depicted in FIG. 17 or FIG. 18, when formed at the rear mirror, can be efficiently used to implement a Distributed Bragg Reflector (DBR), usually at this end. A DBR is usually associated with SM devices, but it is useful also for BALs. An efficient DBR needs a reasonable variation of the modal refractive index in the grating. As shown in FIGS. 10A-10D, the dependence of the fundamental mode refractive index as a function of etch depth b is more pronounced toward the maximum possible etch depth of the upper cladding 3. In a standard symmetric transversal structure the reasonable variation of the modal refractive index is reached by deep etching of the upper cladding 3 down to the core waveguide 1, what make the etching more difficult. In FIG. 17 and FIG. 18, the step 43 is already close to the core waveguide so that an efficient grating can be formed by a relatively shallower etching into a thinner layer. For structures with double waveguide, an even more efficient grating can be obtained after the etching of the active waveguide.

The multiple examples for implementing graded vertical tapers in end segments in BALs as well in SM devices shows that, beside the use of these end segments as means to reduce the fundamental mode confinement factor Γ, they can be used for other auxiliary purpose too: as filter for lateral fundamental mode operation, for narrowing the lateral near field, for easier implementation of DBRs, for wafer definition of lens. The vertical tapers can be used for combination of the above purposes.

REFERENCES

[1] PETRESCU_PRAHOVA et al., "High Brightness 810 nm Long Cavity Diode Lasers with high d/gamma Ration in Asymmetric Low Confinement Epitaxial Structures," Laser and Electro-Optics Society 2001 Conference, LEOS 2001 the 14th Annual Meeting of the IEEE, p. 135, (2001).
[2] PETRESCU-PRAHOVA et al., "253 mW/um maximum power density from 9xx nm epitaxial laser structures with d/gamma greater than 1 um," IEEE 21st International Semiconductor Laser Conference, 2008, ISLC 2008, p. 135 (2008).
[3] BAOXUE et. al., "A novel structure for high peak power semiconductor lasers," ICO 20 Laser and Laser Technologies Conferences, Proc. of SPIE Vol. 6028, 60280U, (2005).
[4] MOERMAN et. al., "A review on fabrication technologies for the monolithic integration of tapers with III-V semiconductor devices," IEEE JOURNAL OF SELECTED TOPICS IN QUANTUM ELECTRONICS, VOL. 3, NR. 6, PAGE(S) 1308-1320, (1997).

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. An edge emitter semiconductor laser type device that comprises in a longitudinal direction, between two mirrors:
   a main segment; and
   between the main segment and one of the two mirrors, at least one end segment for protecting that mirror;
   the main segment comprising a main layered optical transversal structure with selected optical properties, which allows, in the longitudinal direction, preferentially the amplification of a transversal fundamental mode, the main layered optical transversal structure comprising:
   a core waveguide that includes an active region;
   an upper cladding, containing the radiation that extends above of the core waveguide;
   a lower cladding, containing the radiation that extends bellow of the core waveguide, the lower cladding being thicker than the upper cladding;
   the lower cladding containing a trapping waveguide that constitutes together with the core waveguide a double waveguide;
   the lower cladding having on average a higher refractive index than that of the upper cladding;
   the refractive index profile of the transversal structure being asymmetric, the radiation field of the fundamental mode is preponderantly distributed on the lower side of the optical structure;
   the double waveguide is designed for the preferential amplification of the fundamental transversal mode, which is the best coupled with the active region and has the highest confinement factor among all modes;
   in the end segment, a taper is formed by a plurality of transitory layered optical transversal structures derived from the main layered optical transversal structure of the main segment by gradually reducing the thickness of the upper cladding,
   wherein the field distribution of the fundamental transversal mode remains trapped by the double waveguide as the thickness of the upper cladding is gradually reduced;
   wherein the tapered segment has the role of reducing the confinement factor of the fundamental transversal mode traversing the end segment by shifting the field distribution from the core waveguide to the trapping waveguide and the role of reducing losses from the fundamental transversal mode that propagates in the tapered segment; the reduction of the confinement factor of the fundamental transversal mode being dependent on the last transversal structure of the plurality of transitory transversal structures, while the losses from the fundamental transversal mode being dependent on the length of the end segment and on the way the thickness is reduced along the end segment; and
   wherein, when the confinement factor for the fundamental transversal mode decreases by up to five times, determining a corresponding increase of resilience against degradation of the protected mirror, the losses from the fundamental transversal mode are reduced to less than 10%.

2. The device according with claim 1, wherein the length of the end segment is about 100 μm.

3. The device according to claim 1, wherein the trapping waveguide of the double waveguide is separated from the core waveguide by a separation layer.

4. The device according to claim 1, wherein the trapping waveguide of the double waveguide is adjacent to the core waveguide.

5. The device according to claim 1, wherein a secondary lower cladding, having a refractive index lower than the refractive index of the lower cladding and a thickness adjusted to keep the exponential decay of the higher order modes inside its extent, is introduced between the lower cladding layer and the substrate, to avoid the extinction of higher order modes by absorption in the substrate and to preserve their transferred flux from the fundamental transversal mode to be back coupled to the fundamental transversal mode.

6. The device according to claim 1, wherein, for the thickness reduction of the upper cladding along a length of about 100 μm of the end segment in a plurality of transitory transversal structures formed by a plurality of steps of constant slope, the thickness reduction becoming substantially continuous and linear as the step size decreases, for about five times reduction of the confinement factor of the fundamental transversal mode, the transfer loss from fundamental transversal mode, by modal coupling to higher order mode, is less than about 3%.

7. The device according with claim 6, wherein a smaller reduction of the confinement factor for the fundamental transversal mode of the active region of the main segment results in a smaller transfer loss.

8. The device according with claim 6, wherein a shorter end segment results in a higher transfer loss, and a longer end segment results in a lower transfer loss.

9. The device according to claim 1, wherein, for the thickness reduction of the upper cladding along a length of about 100 μm of the end segment, in a plurality of transitory transversal structures formed by a plurality of steps of exponentially decaying slope, the thickness reduction becoming substantially continuous and exponentially decaying as the step size decreases, such that the product of the slope function, which is exponentially decaying along the end segment, with the intrinsic coupling coefficient of the fundamental transversal mode with the first order transversal mode, which substantially has an exponential growth along the end segment, is more uniform and, for about five times reduction of the confinement factor of the fundamental transversal mode, the transfer from the fundamental transversal mode, by modal coupling to higher order modes, is less than about 1%.

10. The device according with claim 1, wherein the thickness of the upper cladding along a length of about 100 μm of the end segment is reduced in about 10 equal and uniformly distanced steps, such that, for about five times reduction of the confinement factor of the fundamental transversal mode, the transfer loss from the fundamental transversal mode, by modal coupling to higher order modes, is less than about 5%.

11. The device according with claim 1, wherein, for a two steps thickness reduction of the upper cladding of the mirror protecting end segment shorter than 100 μm, one of the two steps being positioned deeper near the main segment and other one of the two steps being positioned shallower toward the end, the positions being selected for minimum transfer loss by a computationally loss minimizing algorithm, for about 40% reduction of the confinement factor of the fundamental transversal mode, the transfer by modal coupling to higher order modes is less than about 8%.

12. The device according with claim 1, wherein, for a three steps thickness reduction of the upper cladding of the mirror protecting end segment shorter than 100 μm, positions and depths of the three steps being selected for minimum transfer loss by a computationally loss minimizing algorithm, the confinement factor for the fundamental transversal mode is reduced by five times, while the transfer loss from the fundamental transversal mode, by modal coupling to higher order modes, is less than about 5%.

13. The device according with claim 1, wherein a ridge is shaped as a mesa that ends at the end of the main segment, the mesa being evenly surrounded by areas with reduced thickness of the upper cladding, the areas lateral to the ridge assuring the operation in the fundamental lateral mode, and the areas in the front and the back of the ridge being a first step of a stepped reduction of the upper cladding of the end segment, the reduction continuing in steps parallel to the mirrors toward the protected mirror.

14. The device according with claim 1, wherein the transversal structure of a last step of a stepped reduction of the upper cladding of the end segment, having the resilience to degradation increased by a factor up to five times, is shaped to produce a lens for collimation or focusing the fundamental transversal mode.

* * * * *